US012642061B2

(12) United States Patent (10) Patent No.: US 12,642,061 B2
Chang et al. (45) Date of Patent: May 26, 2026

(54) DENDRITE MITIGATION OF PASSIVE COMPONENTS

(71) Applicant: Taiwan Semiconductor Manufacturing Company LTD, Hsinchu (TW)

(72) Inventors: Jui Shen Chang, Taichung (TW); Li-Hsien Huang, Zhubei (TW); Chen-Nan Chiu, Hsinchu (TW); Yao-Chun Chuang, Hsinchu (TW); Yinlung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 371 days.

(21) Appl. No.: 18/225,920

(22) Filed: Jul. 25, 2023

(65) Prior Publication Data

US 2025/0038043 A1      Jan. 30, 2025

(51) Int. Cl.
H10P 90/00          (2026.01)
H10B 80/00          (2026.01)
(Continued)

(52) U.S. Cl.
CPC ......... H10P 90/1906 (2026.01); H10B 80/00 (2023.02); H10W 10/014 (2026.01);
(Continued)

(58) Field of Classification Search
CPC ... H10W 90/10; H10W 90/15; H10W 90/155; H10W 90/723; H10W 90/725;
(Continued)

(56) References Cited

U.S. PATENT DOCUMENTS 7,812,459 B2 * 10/2010 Yu ........................ H10D 84/038
257/E21.511
2005/0269698 A1 * 12/2005 Okada ................. H01L 23/3128
257/737

(Continued)

FOREIGN PATENT DOCUMENTS

TW        202245281 A      11/2022
TW        202310292 A       3/2023

OTHER PUBLICATIONS

Taiwan Office Action of Application No. 11320605440 Dated Jun. 19, 2024.

*Primary Examiner* — Wael M Fahmy
*Assistant Examiner* — Quinton A Brasfield
(74) *Attorney, Agent, or Firm* — Lippes Mathias LLP

(57)          ABSTRACT

A passive device of a semiconductor substrate and method of making same. The passive device includes first and second top metal components on a substrate core having an insulator substrate. A passivation layer is formed over the top metal components and insulator substrate. A first conductive component is formed on the passivation layer electrically contacting the first top metal component, as well as a second conductive component that is formed on the passivation layer and electrically contacts the second top metal component. In addition, the device includes an insulator material that is formed over the first conductive component and the second conductive component. A cavity is defined by the insulator material between the first conductive component and the second conductive component. The device further includes an ABF plug component that is formed in the cavity between the first conductive component and the second conductive component.

20 Claims, 25 Drawing Sheets

(51) Int. Cl.

| | |
|---|---|
| *H10W 10/00* | (2026.01) |
| *H10W 10/10* | (2026.01) |
| *H10W 10/17* | (2026.01) |
| *H10W 42/00* | (2026.01) |
| *H10W 90/00* | (2026.01) |

(52) U.S. Cl.

CPC ......... *H10W 10/061* (2026.01); *H10W 10/17* (2026.01); *H10W 10/181* (2026.01); *H10W 42/00* (2026.01); *H10W 42/121* (2026.01); *H10W 90/00* (2026.01)

(58) Field of Classification Search

CPC ............. H10W 90/727; H10W 90/729; H10W 90/733; H10W 90/735; H10W 90/737; H10W 90/739; H10W 90/753; H10W 90/755; H10W 90/757; H10W 90/759; H10W 10/014–0148; H10W 10/061; H10W 10/17; H10W 10/181; H10W 42/121; H10W 42/273; H10W 42/281; H10W 76/157; H10W 76/167; H10W 76/17–18; H10W 76/40–42; H10W 76/60–67; H01L 25/0657; H01L 25/0652; H01L 25/042; H01L 25/043; H01L 25/0655; H01L 25/071; H01L 25/072; H01L 25/074; H01L 25/0753; H01L 25/0756; H01L 25/112; H01L 25/115; H01L 25/117; H10D 84/0151; H10D 84/0188; H10D 84/929–933; H10D 84/991–992

See application file for complete search history.

(56) References Cited

U.S. PATENT DOCUMENTS

| | | | |
|---|---|---|---|
| 2016/0240490 A1* | 8/2016 | Yin ...................... | H01L 23/562 |
| 2023/0178530 A1 | 6/2023 | Wang et al. | |
| 2023/0223359 A1 | 7/2023 | Wu et al. | |

* cited by examiner

_1400_

START

FORM INSULATOR SUBSTRATE ON SUBSTRATE CORE — 1402

FORM TOP METAL COMPONENTS — 1404

FORM PASSIVATION LAYER — 1406

DEPOSIT AND PATTERN PHOTORESIST — 1408

FORM CONDUCTIVE COMPONENTS — 1410

REMOVE PHOTORESIST — 1412

DEPOSIT INSULATOR MATERIAL — 1414

DEPOSIT AND PATTERN PHOTORESIST — 1416

ETCH INSULATOR MATERIAL — 1418

REMOVE PHOTORESIST — 1420

DEPOSIT ABF MATERIAL — 1422

End

DENDRITE MITIGATION OF PASSIVE COMPONENTS

BACKGROUND

The packages of integrated circuits are becoming increasingly complex, with more device dies packaged in the same package to achieve more functions. For example, System on Integrate Chip (SoIC) has been developed to include a plurality of device dies such as processors and memory cubes in the same package. The SoIC can include device dies formed using different technologies and have different functions bonded to the same device die, interconnected via varying bonding contacts, and mounted to a substrate, thus forming a system. Substrates may be multilayered and include one or more active or passive components. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
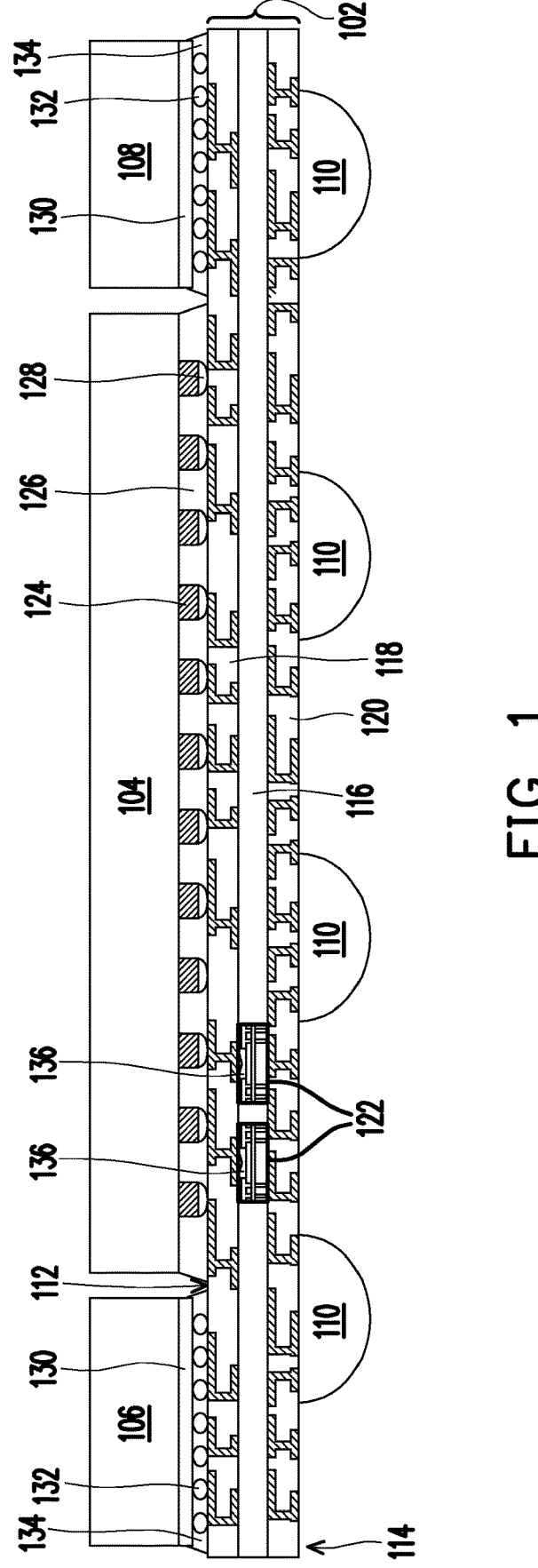
FIG. 1 is an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g., "about 2 to about 4" also discloses the range "from 2 to 4." The term "about" may refer to plus or minus 10% of the indicated number.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductor and contact layers (in which interconnect lines and/or via contacts are formed) and one or more dielectric layers.

A substrate used in semiconductor manufacturing may be fabricated with a plurality of layers, e.g., passivation layers, polyimide layers, conductive layers, other dielectric layers, etc., and may also include a variety of passive components formed within the layers. In some embodiments, one or more electrodes of passive components are formed on a passivation layer of the substrate. Generally, a polyimide material is deposited or formed between electrodes of these passive components. During fabrication of a semiconductor substrate, various materials are used to form the substrate, each of which may require different manufacturing processes, temperatures, and environments. In some circumstances, the variation in temperature may result in delamination of the polyimide material from the electrode material or the passivation layer. In other circumstances, dendrites of the electrode material may form under the polyimide material as a result of stresses imparted by temperature or material changes. Overlaying this combination of polyimide material and passive component electrodes is a build-up layer, e.g., Ajinomoto Build-up Film ("ABF"), one commonly used material in substrate manufacturing. This ABF material is an insulation layer typically containing combined organic epoxy resins, hardener, and inorganic microparticle filler(s). As will be appreciated, this curing of the ABF material may also negatively affect the interface of the polyimide material to the electrode material and/or the passivation layer. In some embodiments set forth herein, an ABF plug component is utilized to ameliorate dendrite formation and/or polyimide delamination.

Turning now to FIG. 1, there is illustrated a semiconductor device 100 comprising a substrate 102, a system on chip (SoC) component 104, a first DRAM component 106, a second DRAM component 108, and a ball grid array (BGA) 110. It will be appreciated that the illustration in FIG. 1 is intended merely as one example usage of a substrate 102 fabricated utilizing an ABF plug component in accordance with some embodiments (as discussed in greater detail below in FIGS. 2-3). That is, the example semiconductor device 100 is representative of any semiconductor device utilizing a substrate 102 incorporating ABF plug component 136 of the present disclosure.

As illustrated in FIG. 1, the substrate 102 includes a top surface 112 and a bottom surface 114. The SoC component 104, the first DRAM component 106 and the second DRAM component 108 are coupled to the top surface 112 of the substrate 102, as discussed below. The bottom surface 114 of the substrate 102 may include one or more bumps/balls of the BGA 110, as depicted in FIG. 1. The substrate 102 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In other embodiments, the substrate 102 may be an SOI substrate. As will be appreciated, an SOI substrate includes a layer of a semiconductor material such as epitaxial silicon, germanium, silicon germanium, SOI, SGOI, or combinations thereof. In the embodiment illustrated in FIG. 1, the substrate 102 is based upon an insulating core 116, such as, for example and without limitation, a fiberglass reinforced resin core, e.g., fiberglass resin such as FR4, bismaleimide-triazine BT resin, or other PCB materials or films.

In some embodiments, the substrate 102 includes a top ABF layer 118 and a bottom ABF layer 120. It will be appreciated that other build up films or laminates may be used for the substrate 102. The substrate 102 may include active and passive devices, generally designated as the passive device components 122 in FIG. 1. In some embodiments, the substrate 102 includes an array of passive components 122 deployed throughout the substrate 102. It will be appreciated that a wide variety of devices such as transistors, capacitors, resistors, combinations thereof, and the like may, be used to generate the structural and functional requirements of the design for the semiconductor device 100. The passive device components 122 illustrated in FIG. 1 may be formed using any suitable methods, as discussed in greater detail below. In accordance with some embodiments, the passive device components 122 include a portion of the ABF layer 118 positioned between conductive components of the passive device component 122, referred to hereinafter as an ABF plug component 136, as discussed in FIGS. 2-3.

The substrate 102 may also include metallization layers, vias and bond pads (not shown). It will be appreciated that such metallization layers may be formed over the active and passive devices 122 and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

The SoC component 104 of the semiconductor device 100 is suitably mounted to the substrate 102 as shown in FIG. 1. It will be appreciated that any SoC component 104, i.e., any integrated circuit design combining many or all high-level function elements of an electronic device onto a single chip may be used in accordance with the described embodiments. Further, the skilled artisan will appreciate that while and SoC component 104 is illustrated in FIG. 1, any SoC, SoIC, ASIC, memory, logic, etc., component is contemplated herein. As illustrated in FIG. 1, semiconductor device 100 includes an SoC underfill 124 disposed between a bottom of the SoC component 104 and the top surface 112 of the substrate 102. The semiconductor device 100 further includes one or more SoC pillars or contacts 126 interspersed in the SoC underfill 124 positioned between the bottom of the SoC component 104 and the top surface 112 of the substrate 102. Securing the SoC component 104 to the substrate 102 are SoC solder components 128, as will be appreciated by the skilled artisan, enabling electric coupling of the SoC pillars or contacts 126 to metal contacts of the substrate 102.

In accordance with some embodiments, the SoC underfill 124 may suitably comprise, for example and without limitation, a liquid epoxy, deformable gel, silicon rubber, or the like, that is dispensed between the SoC component 104 and the top surface 112 of the substrate 102, which is then cured to harden. In some embodiments, the SoC underfill 124 may be used, among other things, to reduce cracking in and to protect the SoC pillars or contacts 126.

The semiconductor device 100 of FIG. 1 further includes a first DRAM component 106 and a second DRAM component 108. In some embodiments, each DRAM component 106 and 108 may include a DRAM substrate 130, DRAM bumps 132, and DRAM underfill 134, as illustrated in FIG. 1. In accordance with some embodiments, the DRAM underfill 134 may include, for example and without limitation, a liquid epoxy, deformable gel, silicon rubber, etc., which is placed between the DRAM component 106 or 108 and the top surface 112 of the substrate 102. As shown in FIG. 1, the DRAM bumps 132 are formed on the underside of the DRAM substrate 130, with the DRAM bumps 132 configured to contact metal components disposed on or in the top ABF layer 118 of the substrate 102.

As briefly mentioned above, the bottom surface 114 of the substrate 102 may include a ball grid array (BGA) 110, as shown in FIG. 1. It will be appreciated that the solder balls of the BGA 110 may be suitably arranged in a variety of different configurations and numbers in accordance with the design considerations of the semiconductor device 100, and the present disclosure is not limited to the configuration illustrated in the example embodiment of FIG. 1. Further, as will be appreciated, the type of ball used in the BGA 110, the material thereof, etc., may be selected in accordance with design considerations of the semiconductor device 100.

Figure 2:
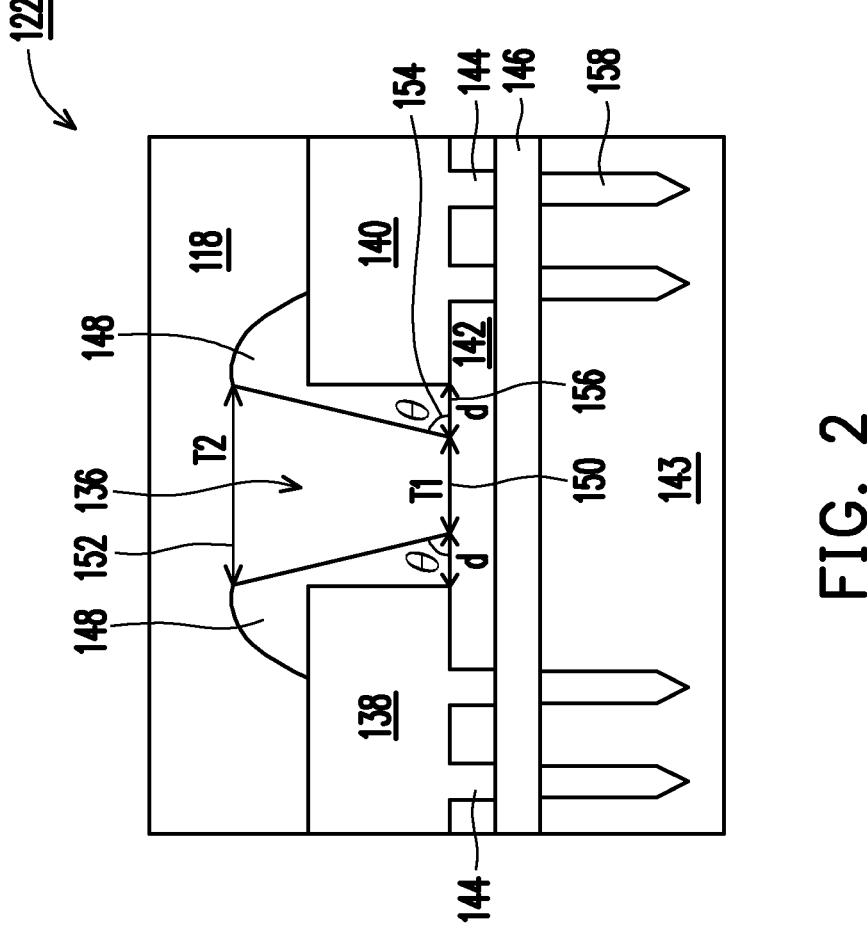
FIG. 2 is a cross-sectional view of a passive component in accordance with some embodiments.

Turning now to FIG. 2, there is shown a cross-sectional view of a passive device component 122 utilizing an ABF plug component 136 in accordance with one example embodiment. As indicated above with respect to FIG. 1, the exemplary passive device component 122 may be formed within or on the substrate core 116. As shown in FIG. 2, the passive device component 122 includes a first passive device conductive component 138 and a second passive device conductive component 140. It will be appreciated that the first and second passive device conductive components 138-140 may be fabricated of any suitable conductive material including, for example and without limitation, copper, gold, aluminum, metals, alloys, or the like. In some embodiments, the first passive device conductive component 138 (e.g., VDD or voltage, device) may be implemented as a positive electrode of the corresponding passive device component 122 and the second passive device conductive component 140 (e.g., VSS or voltage, series) may be implemented as a ground of the corresponding passive device component 122. In some embodiments, each passive device component 122 may include more than two electrodes, with the electrodes function to create a change in voltage for the passive device component 122 as will be understood.

As shown in FIG. 2, the first passive device conductive component 138 and the second passive device conductive component 140 are formed on a passivation layer 142. The passivation layer 142 may comprise, for example and without limitation, may be implemented as a suitable dielectric, i.e., insulative, material including, for example and without limitation, silicon dioxide ($SiO_2$) material, silicon nitride ($SiN_x$) material, or the like. In accordance with one embodiment, the passivation layer 142 is formed over at least one top metal component 146, wherein the first passive device conductive component 138 and the second passive device conductive component 140 are electrically contacted to the at least one top metal layer component 146 by vias 144. In some embodiments, the vias 144 comprise the same or difference conductive material as that used in the conductive components 138-140, e.g., copper, gold, aluminum, alloys thereof, metals, metal alloys, etc. The top metal component 146 and passivation layer 142 may be formed on an insulator substrate 143, e.g., ceramic material, fiberglass material, or the like. As shown in FIG. 2, the passive device component 122 further includes one or more connection pins 158 extending from the top metal component 146 through the passivation layer 142 to provide electrical connectivity to the top metal component 146.

As illustrated in FIG. 2, an insulator material 148 is formed on each of the first passive device conductive component 138 and the second passive device conductive component 140. In accordance with some embodiments, the insulator material 148 is a polyimide material. It will be appreciated that other suitable insulator materials may be used including, for example and without limitation, a polyimide material or other suitable material having equivalent thermal stability, chemical resistance, and electrical properties. The insulator material 148, as shown in FIG. 2, is formed on the sides of the conductive components 138-140, extending up from the passivation layer 142 and extending over a portion of the top of the conductive components 138-140.

As shown in FIG. 2, the insulator material 148 includes a bottom insulator opening ("T1") 150 located at the bottom conductive components 138-140 and adjacent to the passivation layer 142 and a top insulator opening ("T2") 152 located at the top of the insulator material 148 on the top of the conductive components 138-140. In accordance with one embodiment, the bottom insulator opening T1 150 corresponds to the width of the ABF plug component 136 adjacent to the passivation layer 142 and the top insulator opening T2 152 corresponds to the width of the ABF plug component 136 at the top of the insulator material 148. In some embodiments, the distance T1 150 may be implemented as the distance between the first conductive component 138/insulator material 148 interface and the insulator material 148/second conductive component 140 interface. In other embodiments, the distance T2 152 may be implemented as the distance between cutting edges of two separated insulator materials 148. As shown in the example embodiment of FIG. 2, the insulator material 148 is configured to have a thickness ("d") 156 at the bottom insulator opening T1 150, and an angle ("θ") 154 of insulator material 148 at the bottom insulator opening T1 150. In the embodiment illustrated in FIG. 2, the ABF plug component 136 comprising ABF material is positioned between instances of the insulator material 148 on each conductive component 138-140. It will be appreciated that the wedge-like formation of the ABF plug component 136 illustrated in FIG. 2 provides tensile strength to the insulator material 148 and conductive elements 138-140 bonding, as the ABF material 118 exerts tensile force against the insulator material 148. In accordance with one example embodiment, when ABF is used as the fill material, the main composition of ABF may be a polymer, which expands when the substrate core 116 assembly temperature exceeds Tg (glass transition temperature) of the ABF, thus generating tensile stress (i.e., force) to prevent delamination between the insulator material 148 and conductive element 138-140 and the insulator material 148 and passivation layer 142. That is, the structural shape, e.g., wedge-like shape, of the ABF material 118 formed as the ABF plug component 136 provides force (tensile) against the insulator material 148, providing for protection against delamination thereof, as well as dendrite formation of the conductive components 138-140. The ABF plug component 136 (formed from the ABF layer 118) may take other shapes as discussed below, including, conical, rectangular (i.e., straight edged), polygonal, ridged, etc., in accordance with the insulator material 148 formation between the conductive components 138-140, and the figures provided herein are merely illustrative examples thereof.

Figure 3:
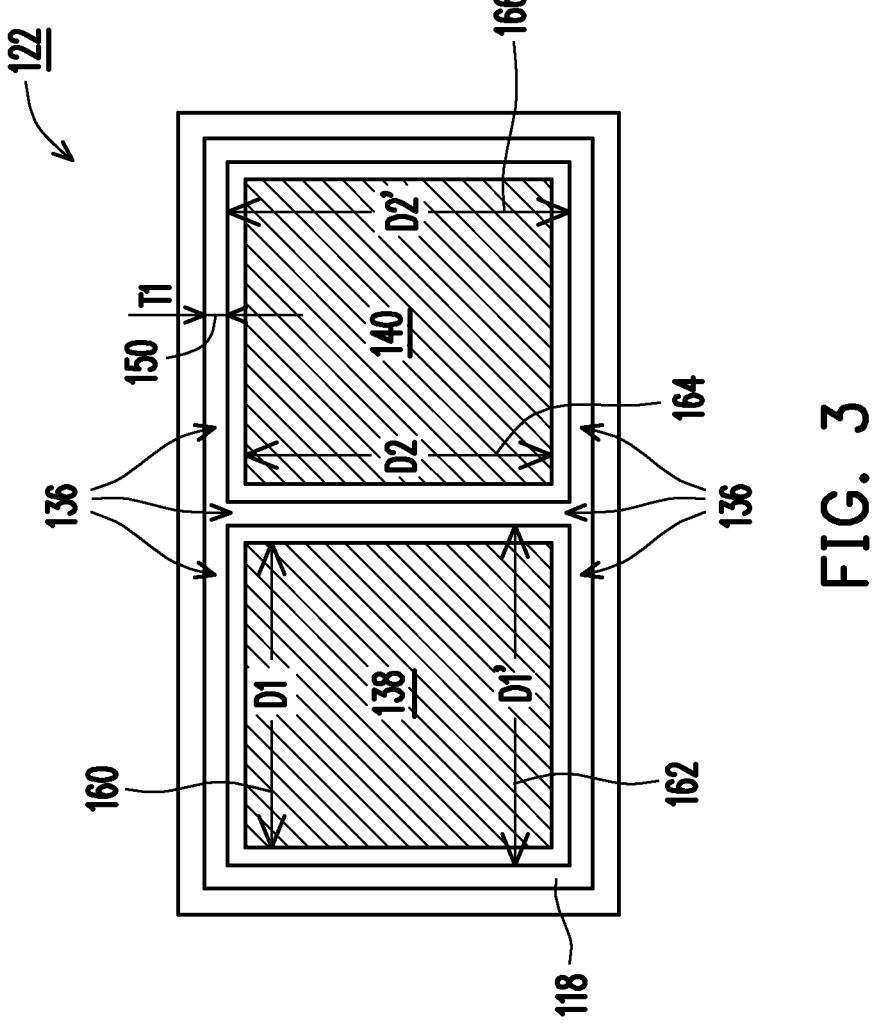
FIG. 3 is a top view of the passive component of FIG. 3 in accordance with some embodiments.

FIG. 3 provides a top view of the passive device component 122 of FIG. 2, which includes the first conductive component 138 and the second conductive component 140. It will be appreciated that although shown in FIGS. 2 and 3 as being substantially rectangular in shape, other shapes of the conductive components 138-140 are contemplated herein, e.g., polygonal, rounded, cylindrical, etc., and the depiction of the conductive components 138-140 in FIGS. 2-3 is intended solely for illustrative purposes only.

As shown in FIG. 3, the insulator material 148 surrounds the conductive components 138-140, advancing from an edge thereof towards the center a predetermined distance. That is, the insulator material 148, in addition to covering the sides of the conductive components 138-140, also partially covers the top surfaces of the conductive components 138-140 in the embodiment illustrated in FIG. 3. In addition to the foregoing, FIG. 3 provides an illustration of various dimensions associated with the insulator material 148, the conductive components 138-140 and the ABF material 118. Thus, a length (D1) 160 of conductive component 138 corresponds to the length of the conductive component 138 uncovered by the insulator material 148 when viewed from the top thereof. The length (D1') 162 of corner to corner of insulator material 148 in the x-direction is also shown in FIG. 3, along with a width (D2) 164 of the conductive component 140 and a width (D2') 166 of corner to corner of insulator material in the y-direction. In accordance with some embodiments, the following relationships to the aforementioned lengths, widths and angles may be used, 0<D1/D1'<1 um; 0<D2/D2'<1 um; 0<d/T2<T1/T2<1 um; and 0°<θ<90°. In some embodiments, an array 168 of passive device components 122 may be formed on or in the substrate core 116.

Figure 4:
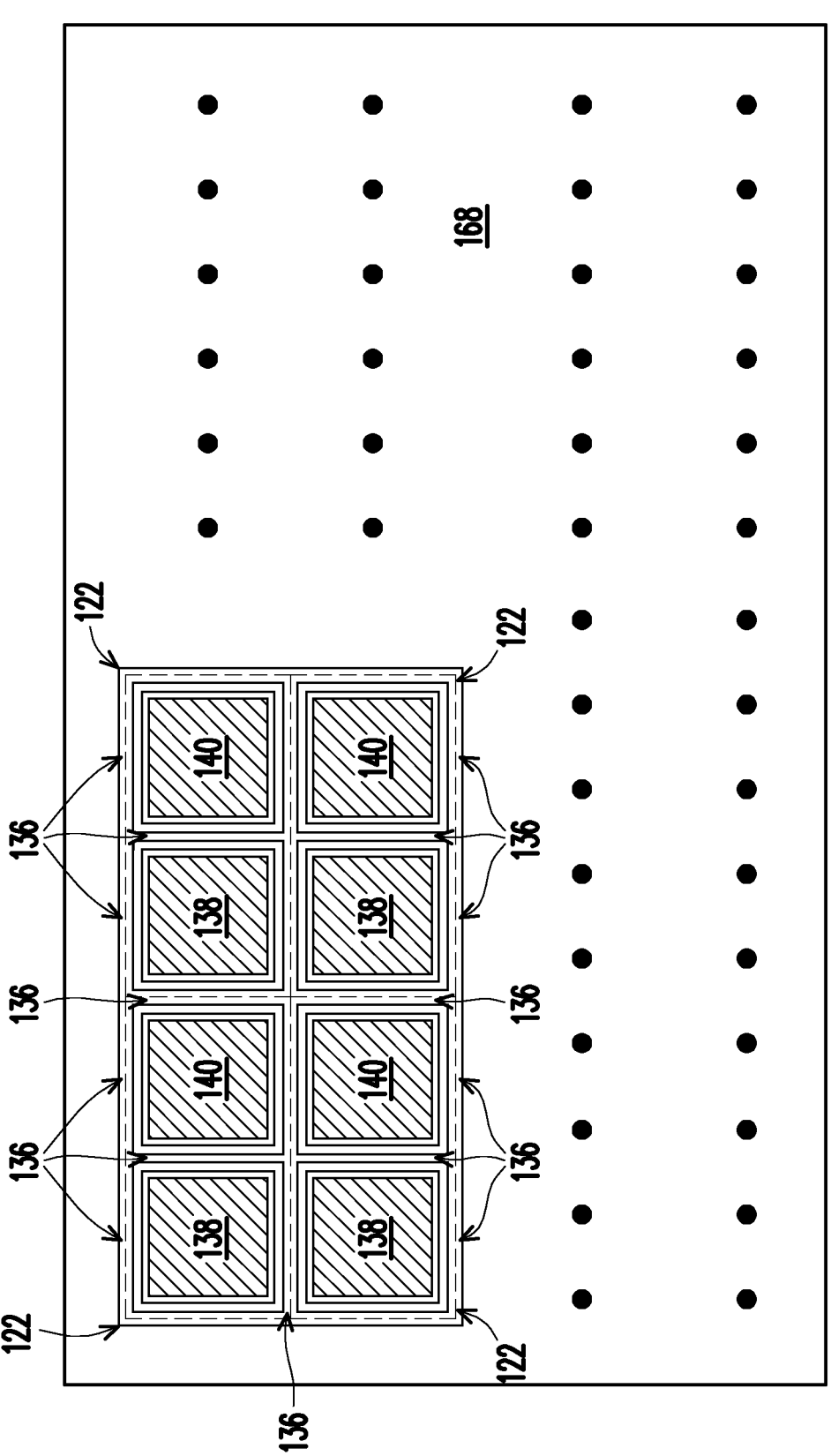
FIG. 4 is a top view of an array of passive components in accordance with some embodiments.
Figure 5B:
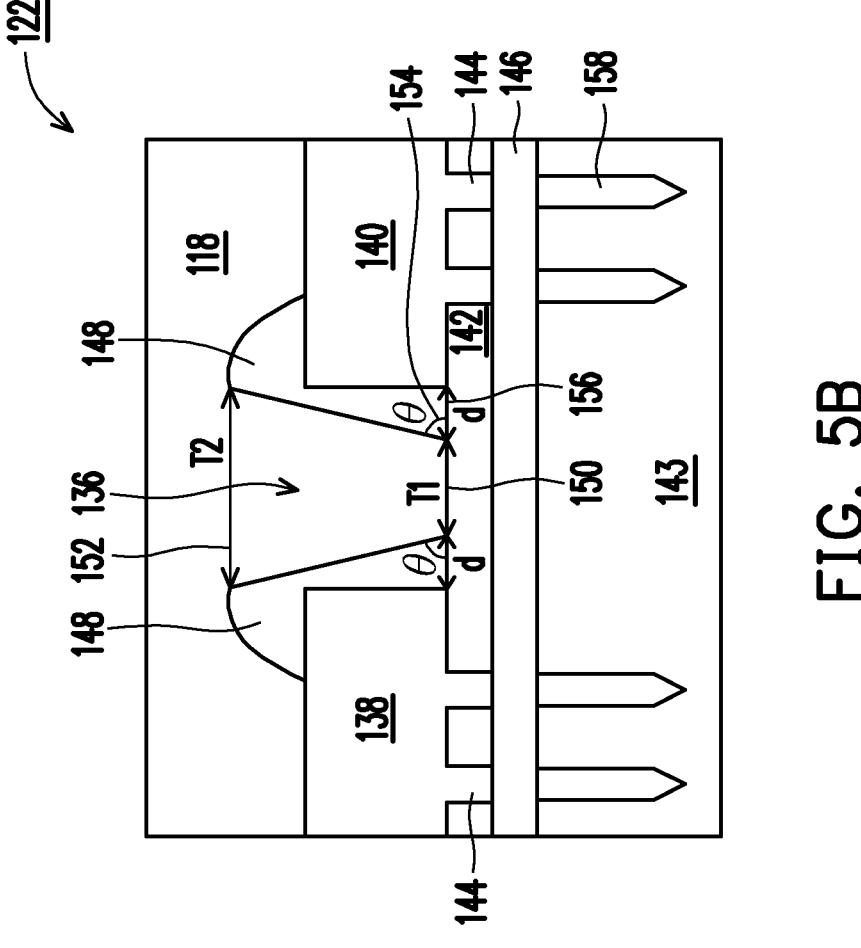
FIGS. 5A-5B are top and cross-sectional views of a portion of the array of FIG. 4.
Figure 5A:
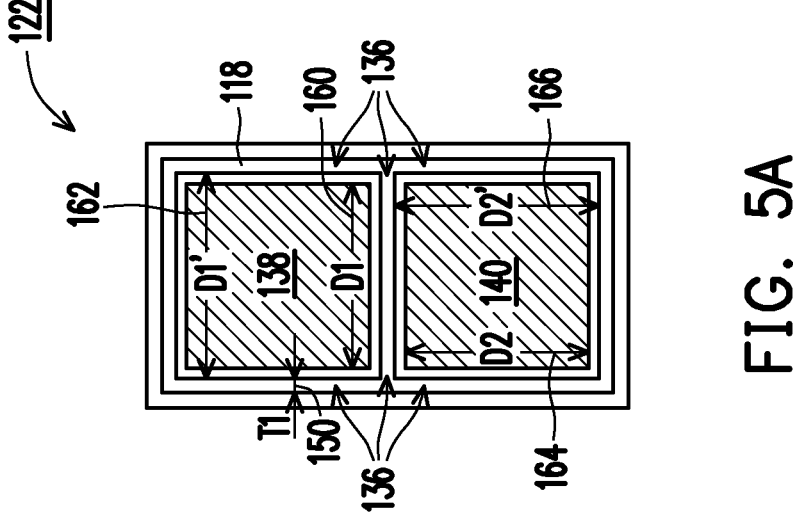

FIG. 4 provides an illustrative top view of such an array 168 of passive device components 122 in accordance with one embodiment. It will be appreciated that as shown in FIG. 4, an ABF plug component 136 is suitably formed in both the x and y directions between adjacent conductive components 138-140. Accordingly, FIG. 5A provides a top view of a portion of the array 168 in the y-direction, with FIG. 5B providing a cross-sectional view of the portion of the array from FIG. 5A. Thus, as shown in FIGS. 5A and 5B, the two passive device conductive components 138 include an ABF plug component 136 positioned therebetween.

Turning now to FIGS. 6A-6M, there is shown a series of simplified cross-sectional views of intermediate fabrication stages of a conductive component 138-140 for a passive device component 122 in accordance with some embodiments. In the following, various layers or films are deposited and patterned. The patterning of a layer may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching, deposition or other process steps laterally delineated by the developed photoresist. In other embodiments, patterning of an electron-sensitive resist layer may be by way of electron beam exposure (electron beam lithography, i.e., e-beam lithography). The skilled artisan will appreciate that the foregoing are merely illustrative examples.

Figure 6A:
FIGS. 6A-6M are a series of simplified cross-sectional views of intermediate fabrication stages of a conductive component for a passive device component in accordance with some embodiments.
Figure 6B:
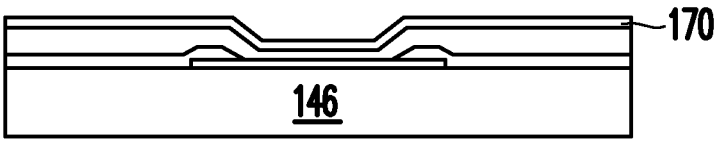
Figure 6C:
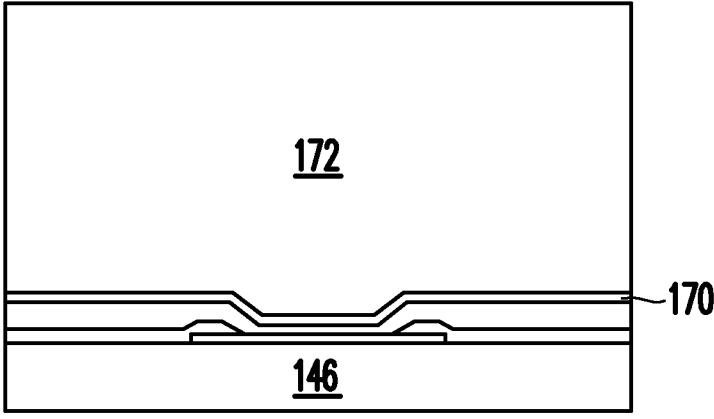

Turning now to FIG. 6A, there is shown a top metal layer component 146 of a passive device component 122 in accordance with one example embodiment. A seed layer 170 is then deposited and/or formed on the top metal layer component 146, as illustrated in FIG. 6B. It will be appreciated that the seed layer 170 may be a thin layer of sputtered or evaporated metal that is deposited for electrical conduction. A photoresist 172 is then deposited on the seed layer 170, as illustrated in FIG. 6C.

Figure 6D:
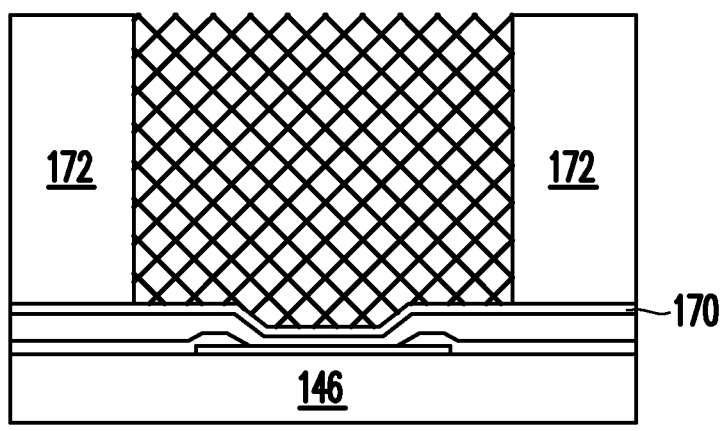
Figure 6E:
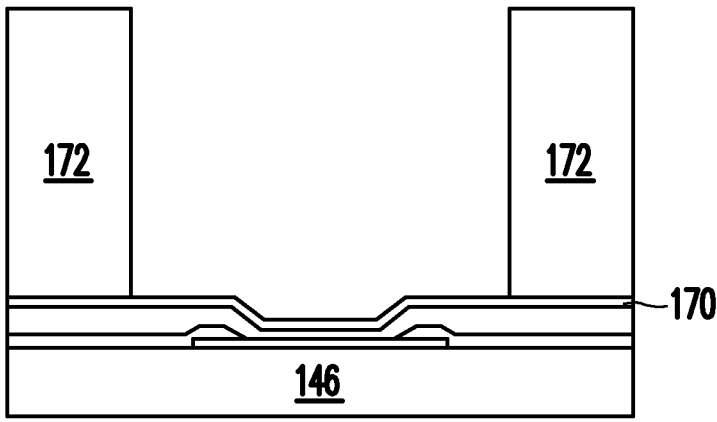
Figure 6F:
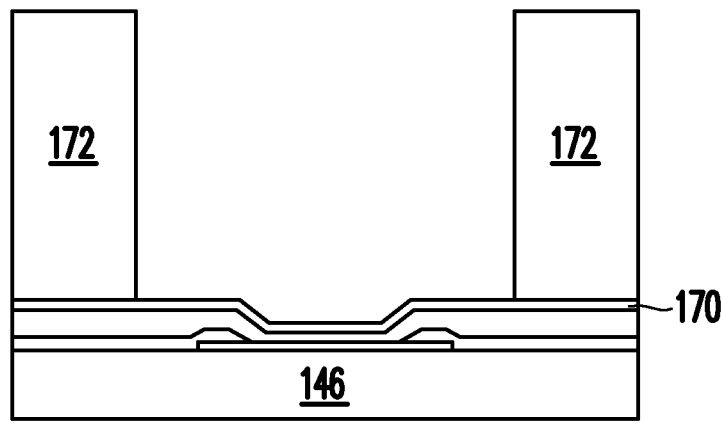
Figure 6G:
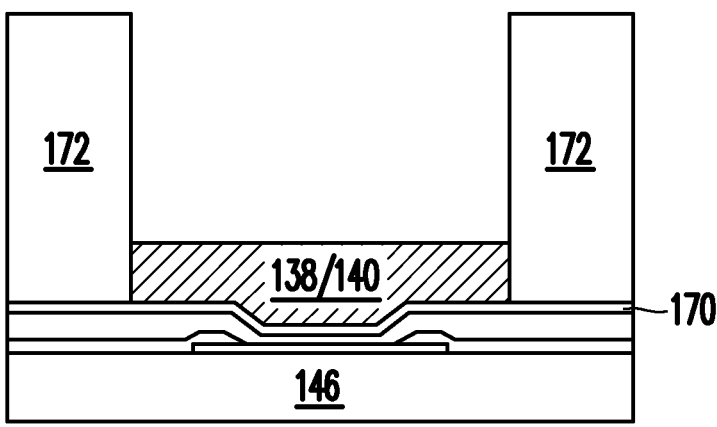

The photoresist 172 is then patterned, e.g., exposed to a suitable light source to activate portions thereof via photo-illumination of an associated mask, as depicted in FIG. 6D. The photoresist 172 is then developed and the undeveloped, i.e., unexposed portion of, the photoresist 172 is removed, forming a cavity as shown in FIG. 6E. In FIG. 6F, descum is performed to remove any contaminants from the seed layer 170 in preparation of deposition of the metal of the conductive component 138-140. Metal plating is then performed, as shown in FIG. 6G. That is, the metal material of the conductive component 138-140 is formed on the seed layer 170. In accordance with some embodiments, the conductive component 138-140 may comprise, for example, a suitable conductive metal including, for example and without limitation, copper, aluminum, gold, iron, metals, metal alloys, and/or alloys thereof, etc. The conductive component 138-140 may be deposited by, for example, chemical vapor deposition (CVD), physical vapor deposition (PVD), atomic layer deposition (ALD), electroless plating, electrochemical plating, sputtering, ion metal plasma, another deposition process, or any suitable combination thereof.

Figure 6H:
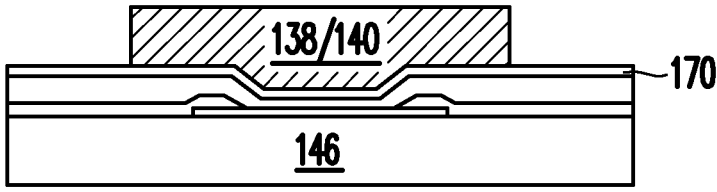
Figure 6I:
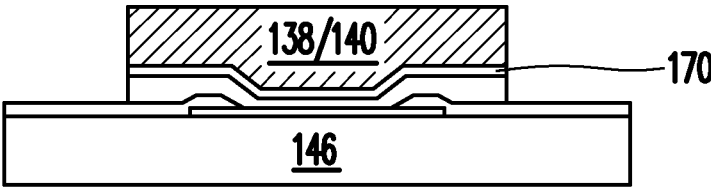

FIG. 6H illustrates the stage of fabrication wherein the photoresist 172 has been removed, leaving exposed the conductive component 138-140. Seed layer etching is then performed to remove those portions of the seed layer 170 uncovered by the conductive component 138-140, as shown in FIG. 6I.

Figure 6J:
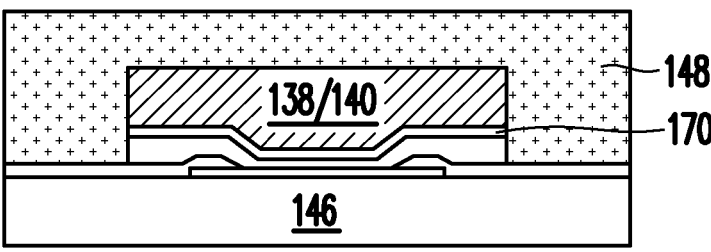
Figure 6K:
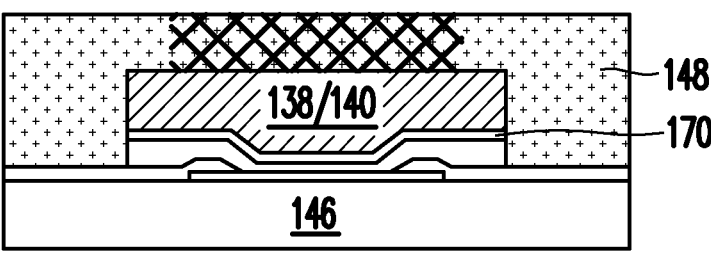
Figure 6L:
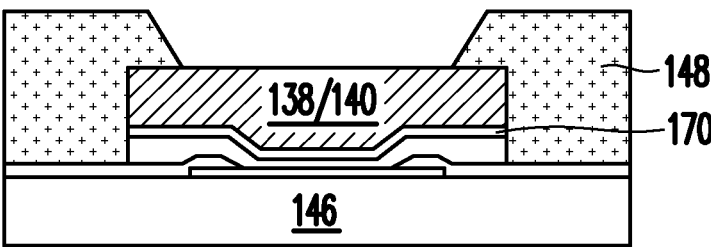
Figure 6M:
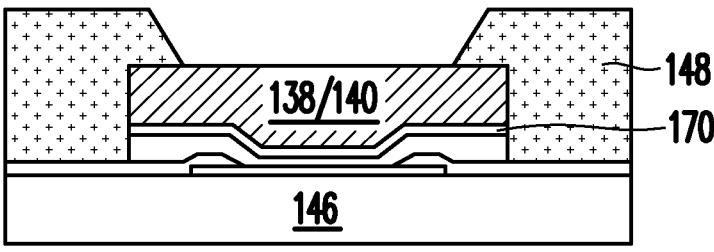

The isolator material 148 is then formed on the conductive component 138-140, as shown in FIG. 6J. The isolator material 148 is then exposed, i.e., patterned as shown in FIG. 6K. The isolator material 148 is then developed in accordance with the exposure pattern, resulting in the partial covering of the conductive component 138-140, as illustrated in FIG. 6L. Thereafter, as shown in FIG. 6M, the isolator material 148 is cured, as will be appreciated, enabling further processing as discussed below with respect to FIGS. 7A-7E.

Figure 7A:
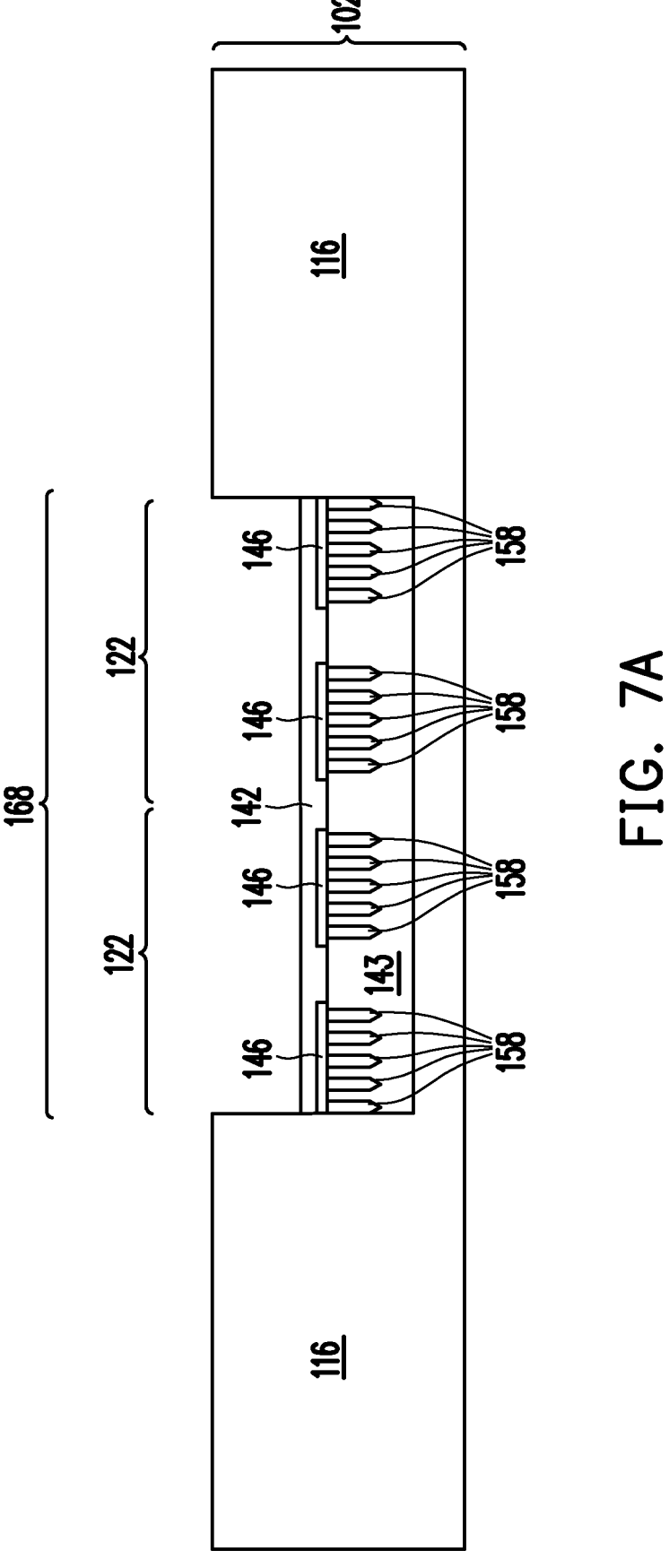
FIG. 7A-7E are a series of cross-sectional views of intermediate fabrication stages of the array of passive components in accordance with some embodiments.
Figure 7B:
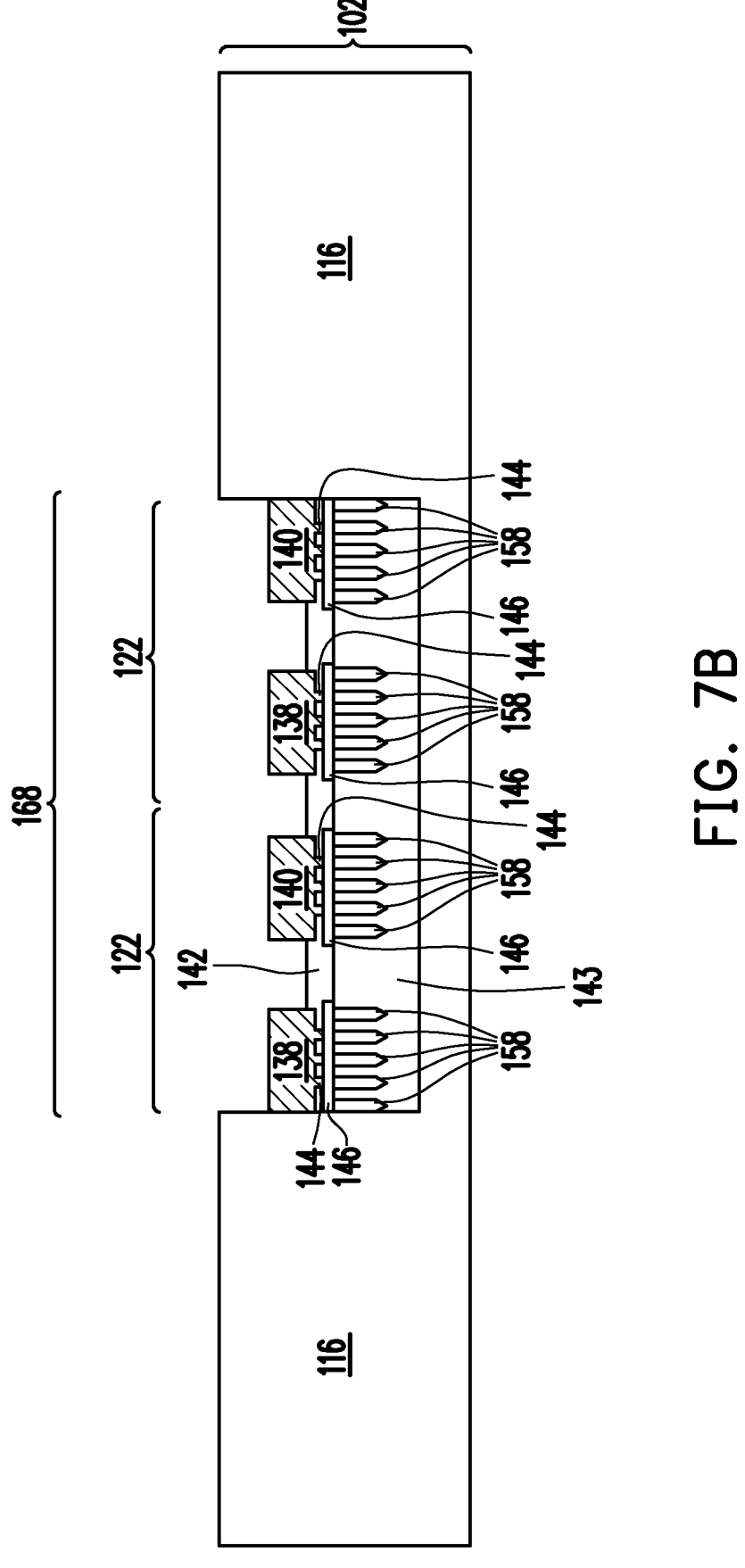

Referring now to FIGS. 7A-7E, there is shown a series of cross-sectional views of intermediate fabrication stages of the array 168 of passive components 122 in accordance with some embodiments. As shown in FIG. 7A, a portions of the passive components 122 comprising the previously described passivation layer 142, insulator substrate 143, top metal component 146 and connection pins 158 are shown formed in the substrate core 116. It will be appreciated that the images presented in FIGS. 7A-7E are simplified in natures and are intended solely to illustrate fabrication of the array 168 or on the substrate core 116 in accordance with some embodiments. FIG. 7B provides an illustration of the array 168 after formation of the passive device conductive components 138-140. FIGS. 6A-6I provide an illustration of the series of fabrication steps involved in the formation of the passive device conductive components 138-140. As illustrated in FIG. 7B, vias 144 have been formed in the passivation layer 142, enabling electrical contact between the conductive components 138-140 and the top metal components 146.

Figure 7C:
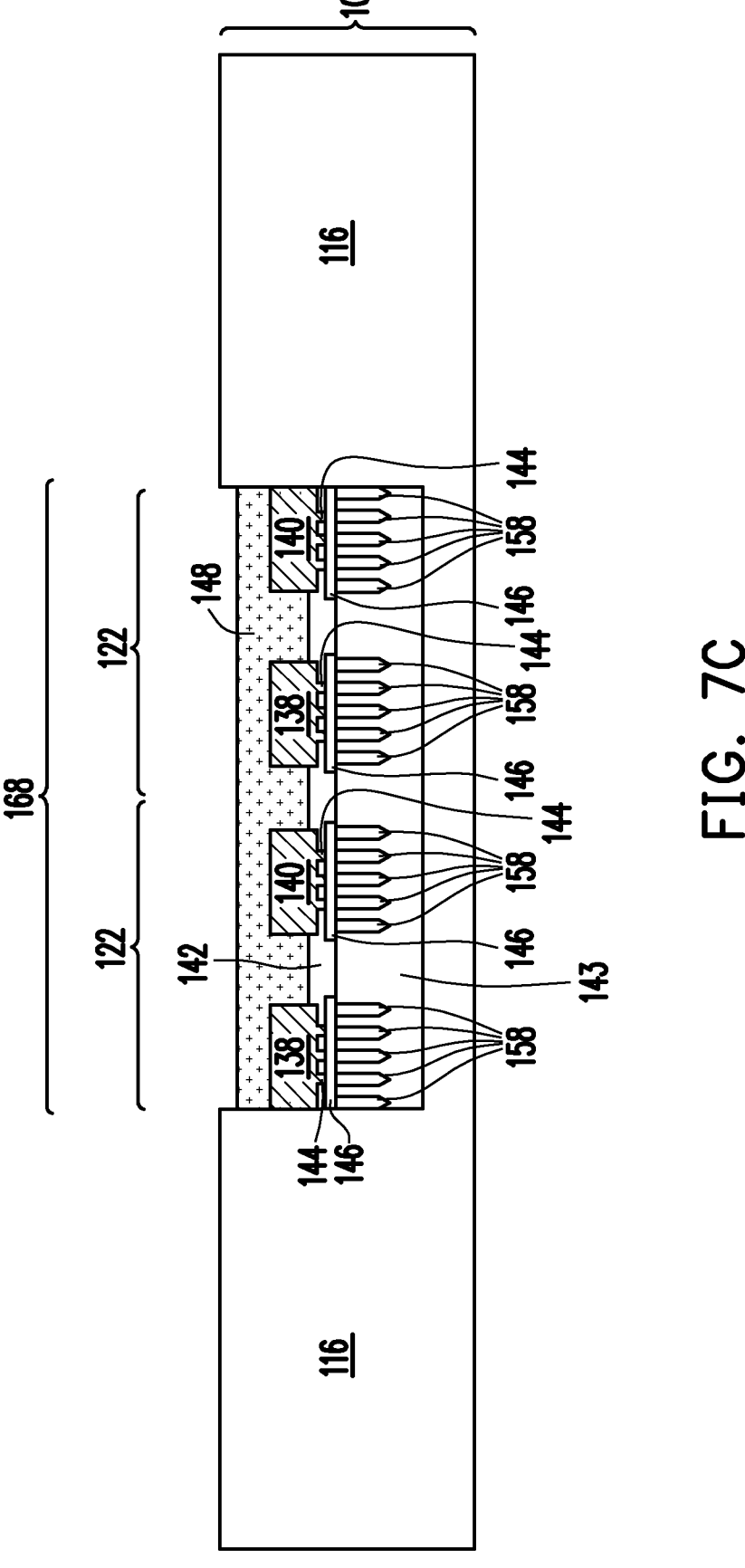
Figure 7D:
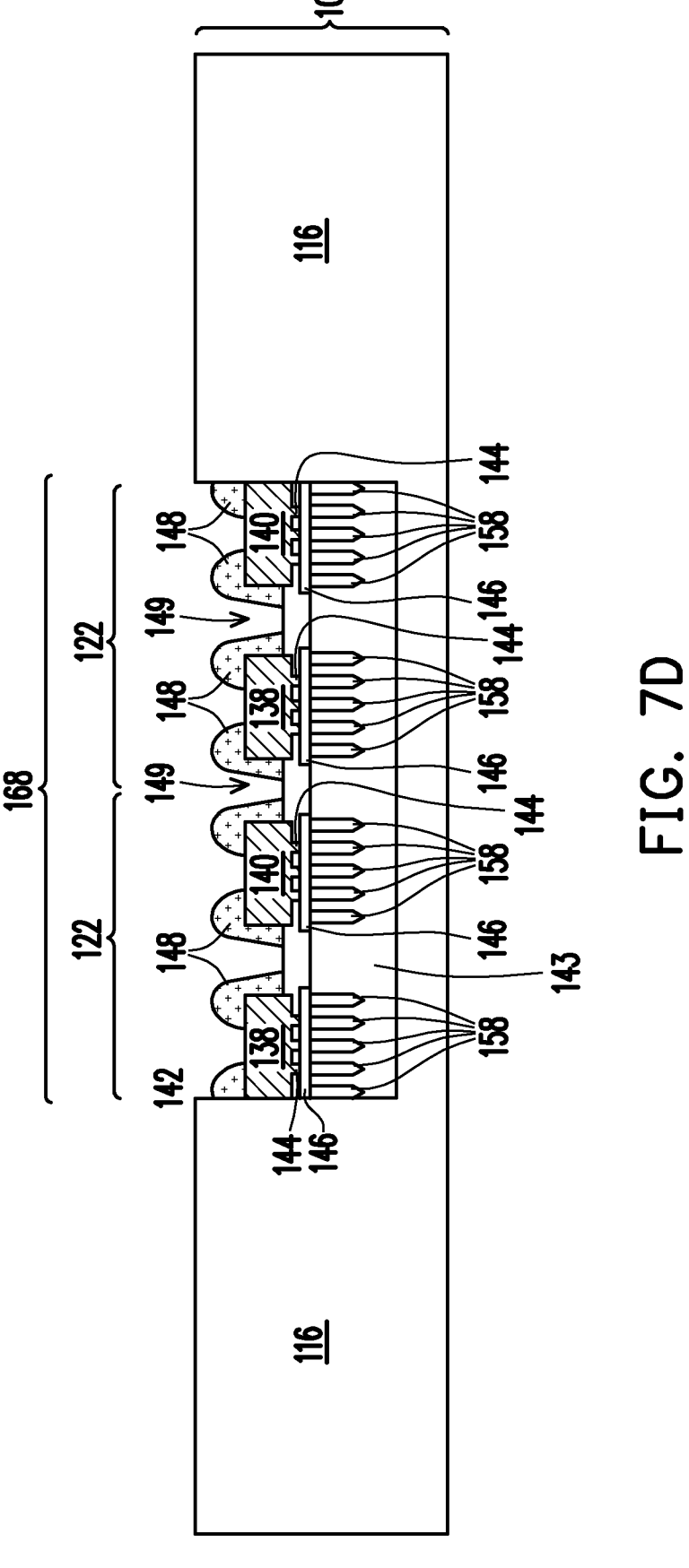
Figure 7E:
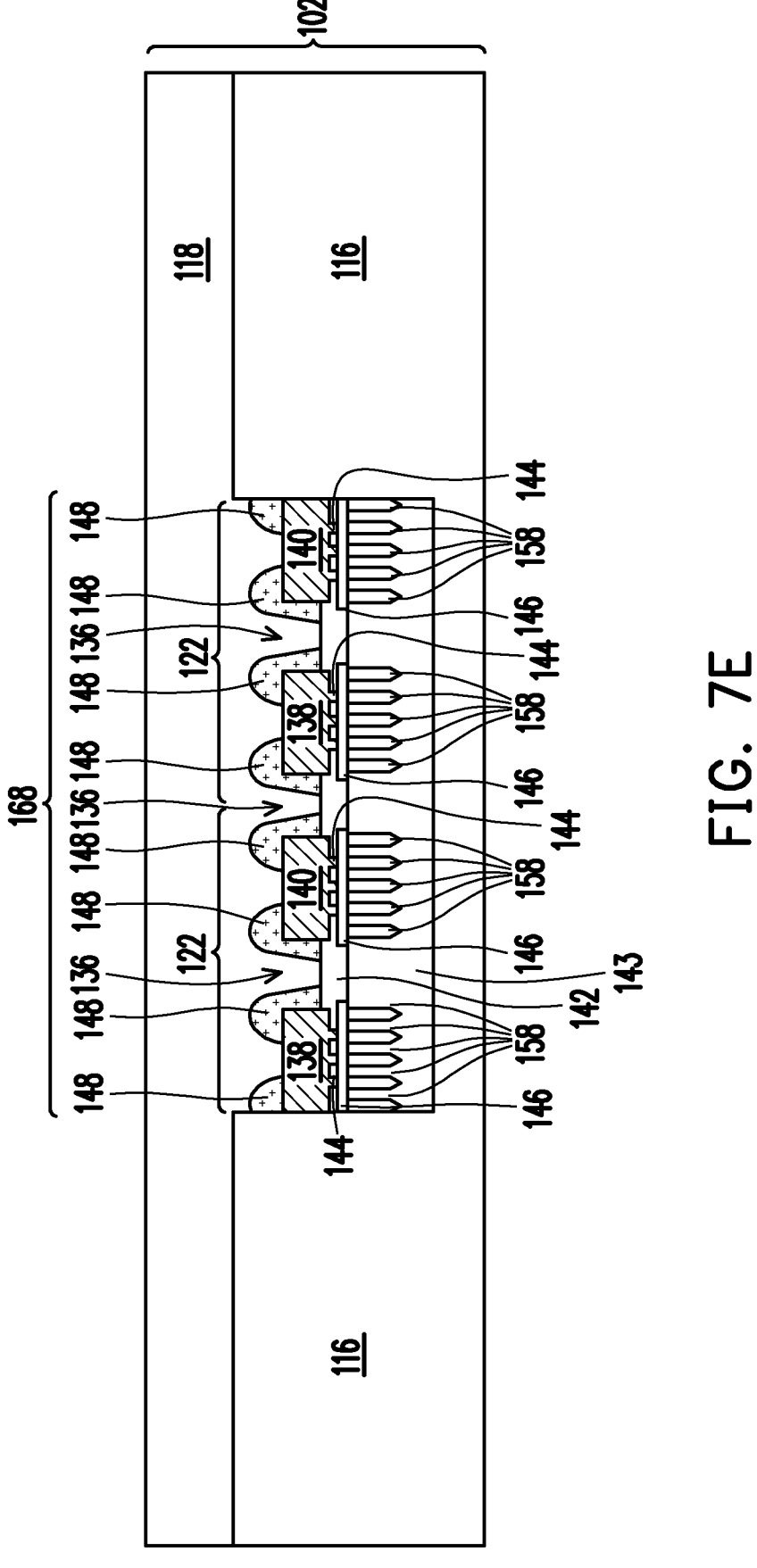

In FIG. 7C, a layer of insulator material 148 is formed on the array 168 of passive components 122. A more detailed illustration of the series of fabrication steps in application of the insulator material 148 for an individual conductive component 138-140 is presented above with respect to FIG. 6J-6K. FIG. 7D provides an illustration of an array 168 of passive components 122 formed in or on the substrate core 116 after patterning of the insulator material 148, and prior to application of the ABF layer 118. As shown in FIG. 7D, a plurality of cavities 149 are formed between adjacent conductive components 138-140. It will be appreciated that the shape of the ABF plug component 136 may be defined by the corresponding shape of the cavity 149, i.e., the ABF layer 118 fills the cavity 149, thereby forming the ABF plug component 136. FIGS. 6L-6M provide a more detailed view of this stage of fabrication. FIG. 7E provides a simplified cross-sectional view of the array 168 subsequent to the application of the ABF layer 118, wherein the ABF plug components 136 are formed between each adjacent conductive component 138-140.

Figure 8A:
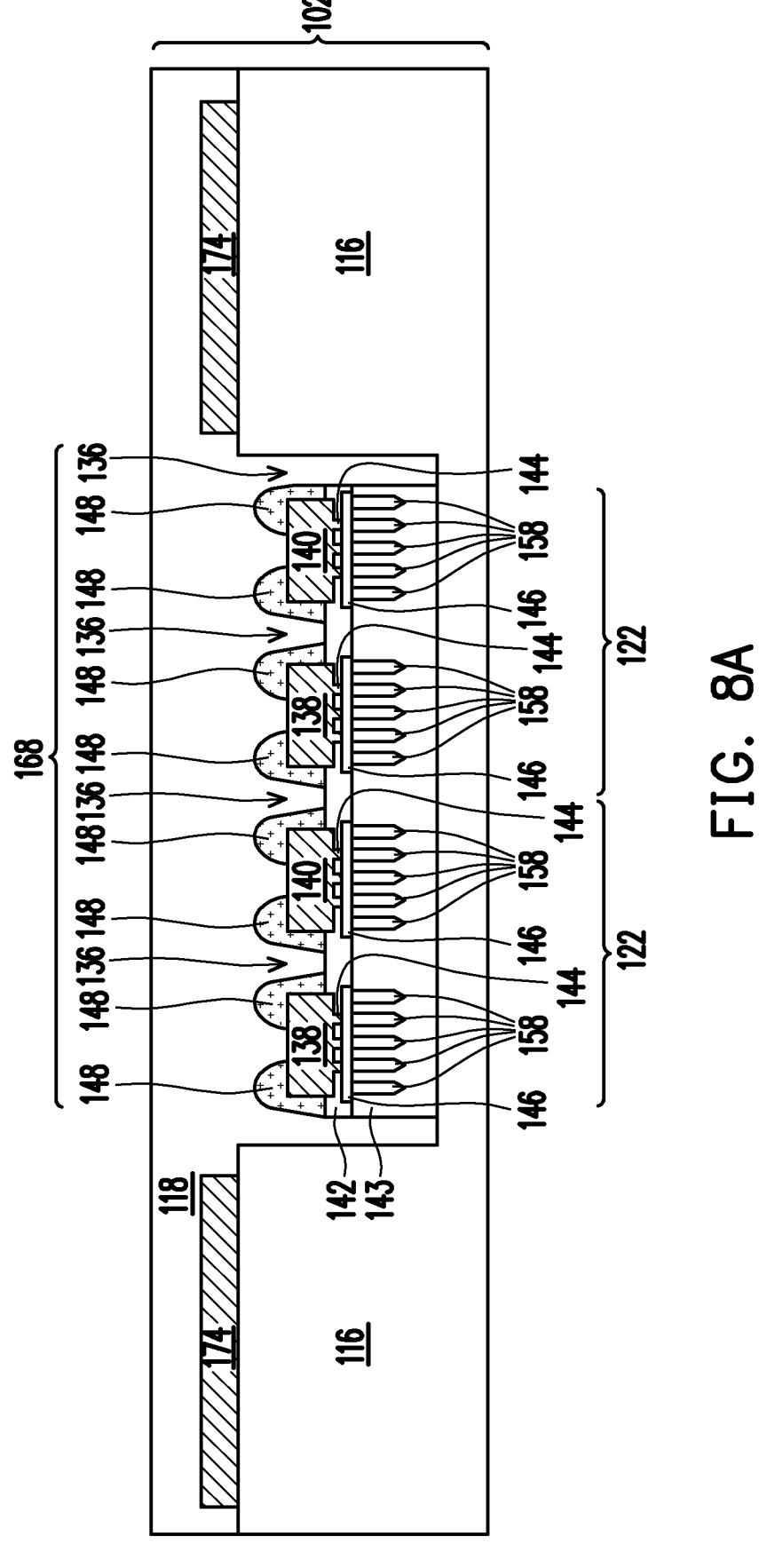
FIGS. 8A-8D are cross-sectional views of the fabrication of the substrate incorporating passive components utilizing the ABF plug components in accordance with one example embodiment.

Turning now to FIGS. 8A-8D, there are shown cross-sectional views of the fabrication of the substrate 102 incorporating passive components 122 utilizing the ABF plug components 136 in accordance with one example embodiment. As shown in FIG. 8A, the substrate 102 depicted therein includes a plurality of passive components 122 disposed on or in the substrate core 116. Formed on the substrate core 116 are one or more metal layers 174, as shown in FIG. 8A. An ABF layer 118 has been formed on the substrate core 116 and metal layers 174, as well as on the passive components 122. In accordance with one embodiment, the application of the ABF layer 118 includes the formation of the ABF plug components 136 between conductive components of the passive device components 122, as discussed above.

Figure 8B:
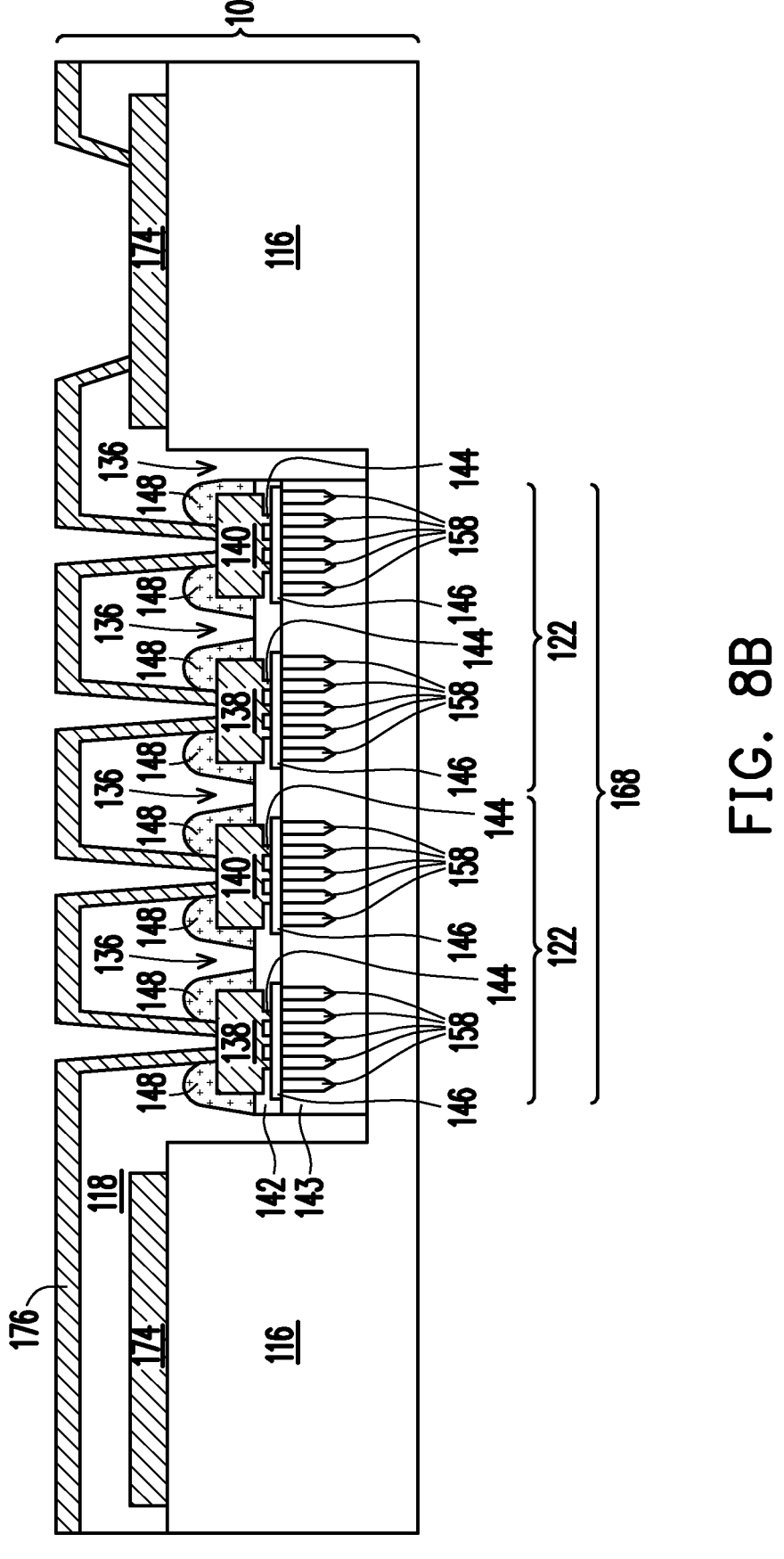
Figure 8C:
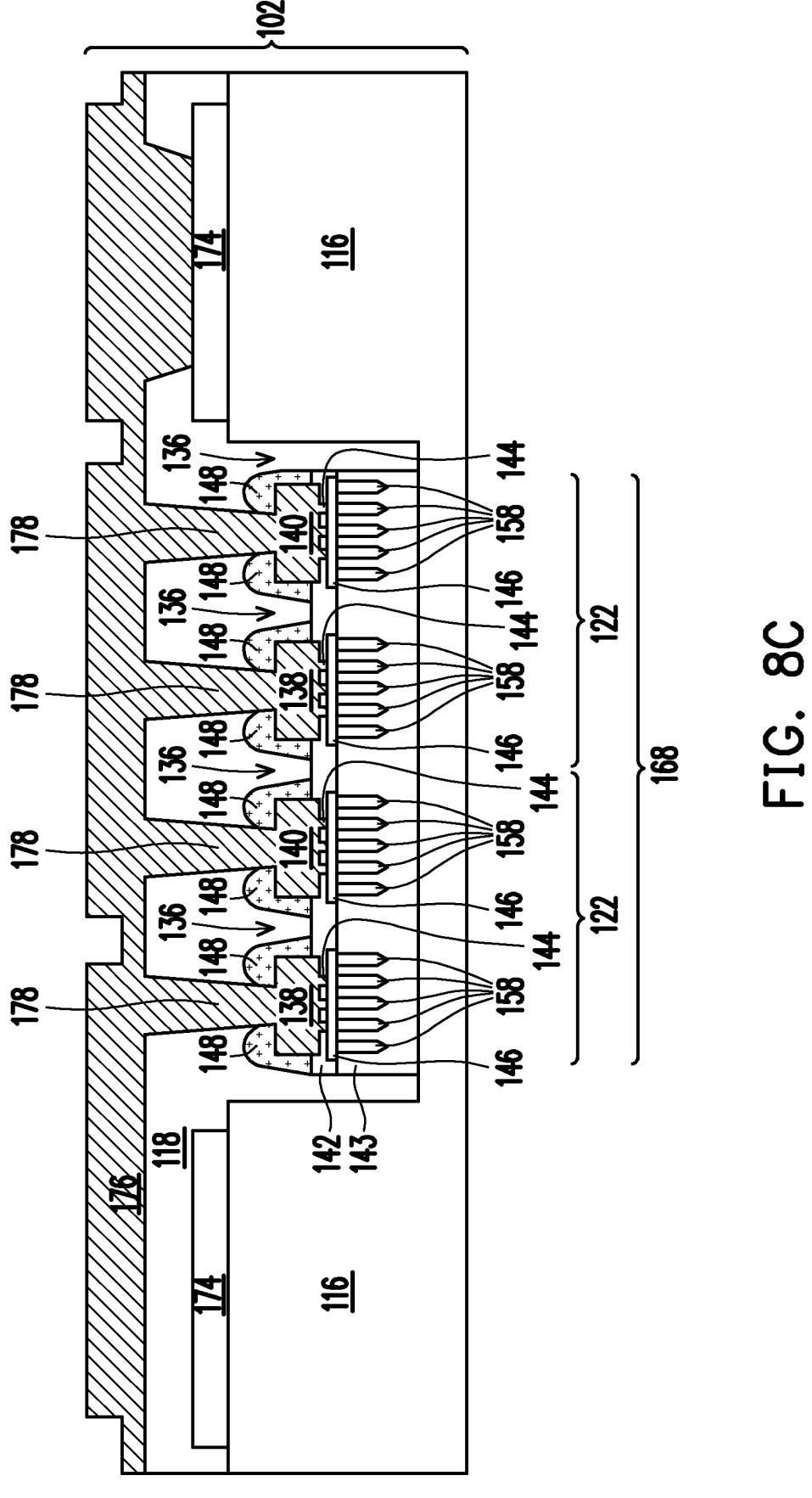
Figure 8D:
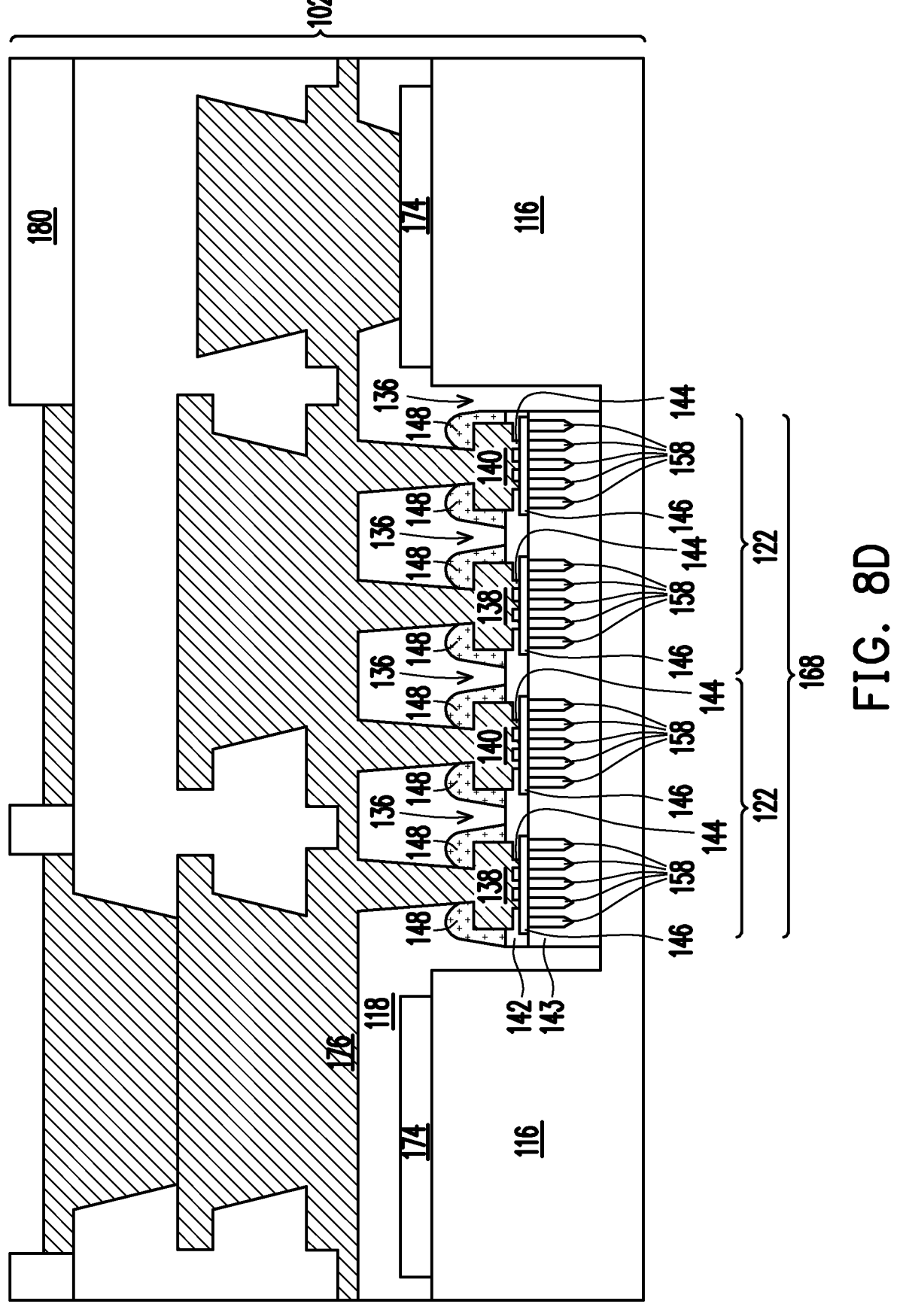

FIG. 8B provides a subsequent stage of fabrication of the substrate 102, whereupon a second metal layer 176 is formed on the ABF layer 118, along with a plurality of cavities exposing the first and second conductive components 138-140. Thereafter, as shown in FIG. 8C, additional metal material is deposited on the substrate 102, forming vias 178 connecting the second metal layer 176 with the first and second conductive components 138-140. As shown in FIG. 8D, additional ABF material is then formed, along with metal layers to complete the fabrication of the top ABF layer 118 of the substrate 102. Solder resist 180 is then formed on the ABF layer 118, as depicted in FIG. 8D.

Figure 9A:
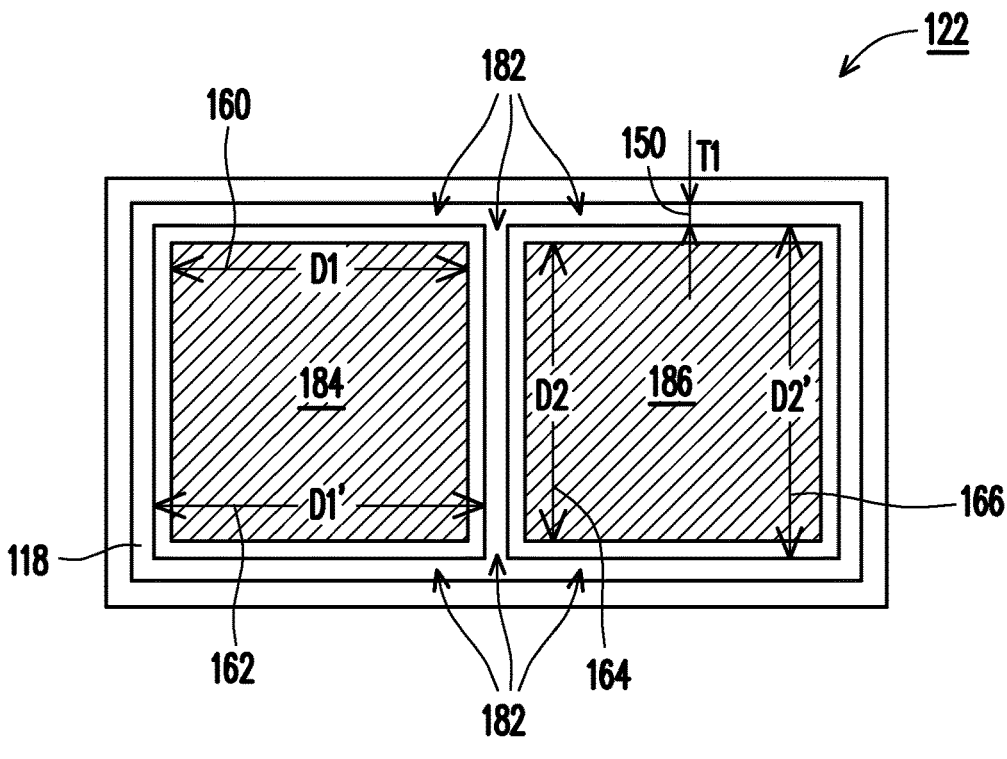
FIGS. 9A-9B are top and cross-sectional views of a second embodiment of an ABF plug component in accordance with one embodiment.
Figure 9B:
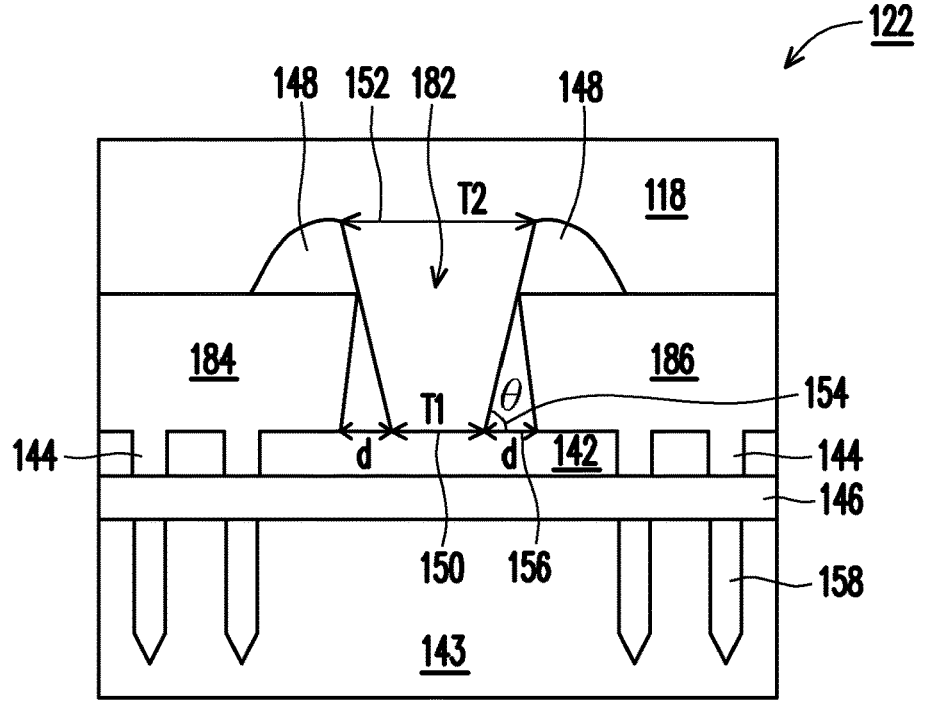

Turning now to FIGS. 9A-9B, there are shown top and cross-sectional views of a second embodiment of an ABF plug component 182, wherein first conductive component 184 and second conductive component 186 are wedge-shaped, tapering from a broader top down to a narrower bottom. As illustrated in FIG. 9B, it will be appreciated that the application of the isolator material 148 maintains the angled structure described above with respect to FIG. 2. It will be appreciated that the dimensions described above with respect to FIGS. 2-3 are also applicable to the embodiment shown in FIGS. 9A-9B.

Figure 10A:
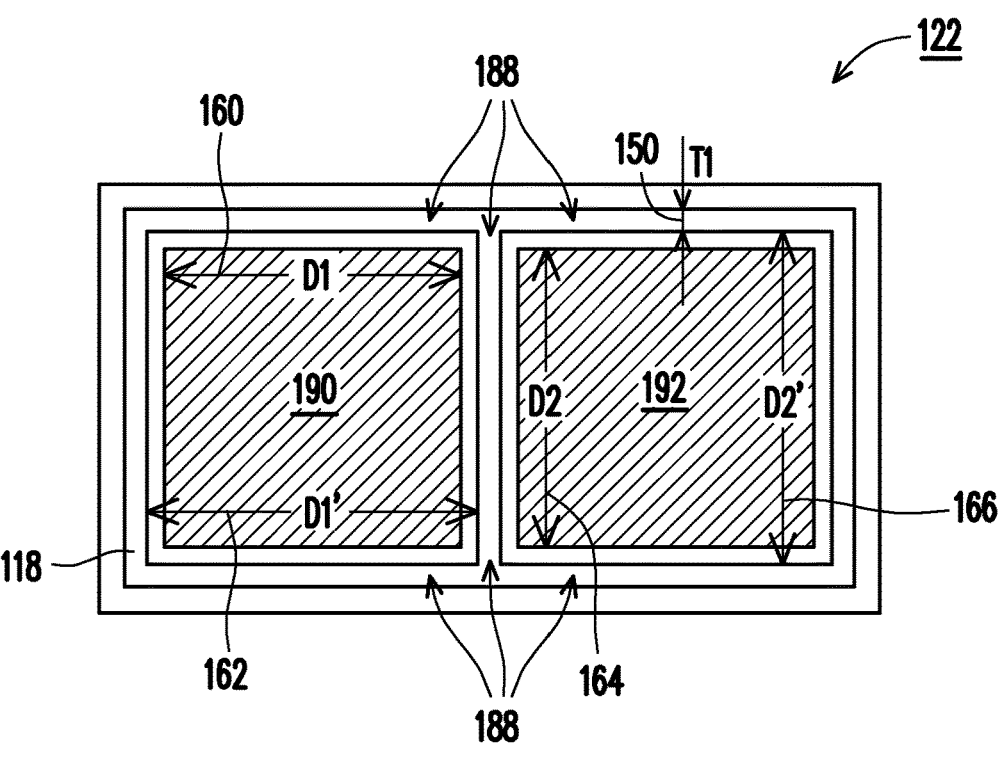
FIGS. 10A-10B are top and cross-sectional views of a third embodiment of an ABF plug component in accordance with one embodiment.
Figure 10B:
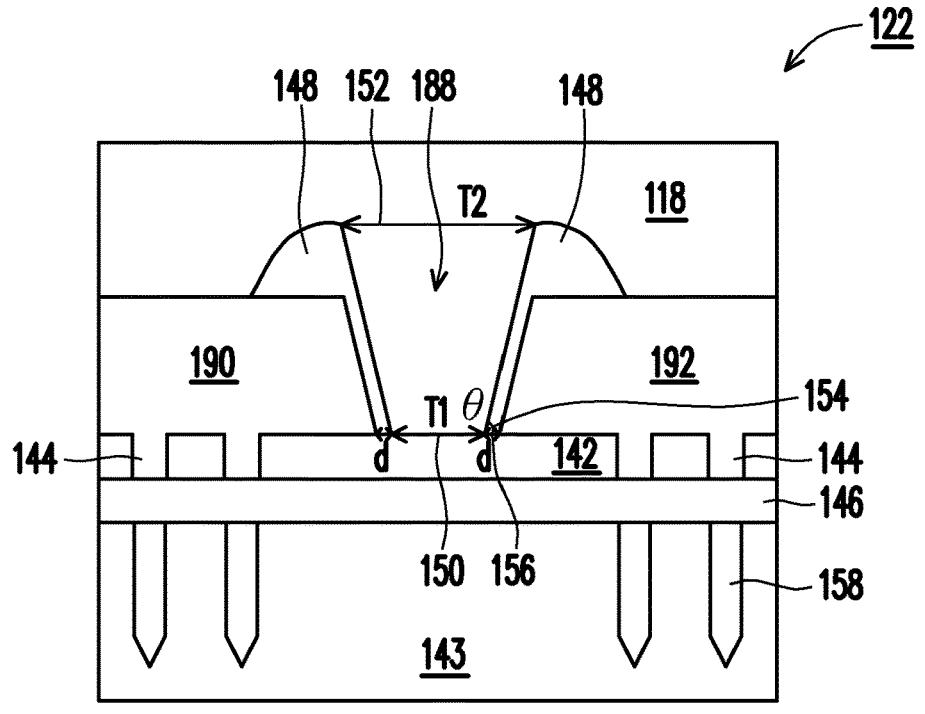

Turning now to FIGS. 10A-10B, there are shown top and cross-sectional views of a third embodiment of an ABF plug component 188, wherein first conductive component 190 and second conductive component 192 are wedge-shaped, tapering from a narrow top down to a broader bottom. As illustrated in FIG. 10B, it will be appreciated that the application of the isolator material 148 maintains the angled structure described above with respect to FIG. 2. It will be appreciated that the dimensions described above with respect to FIGS. 2-3 are also applicable to the embodiment shown in FIGS. 10A-10B.

Figure 11A:
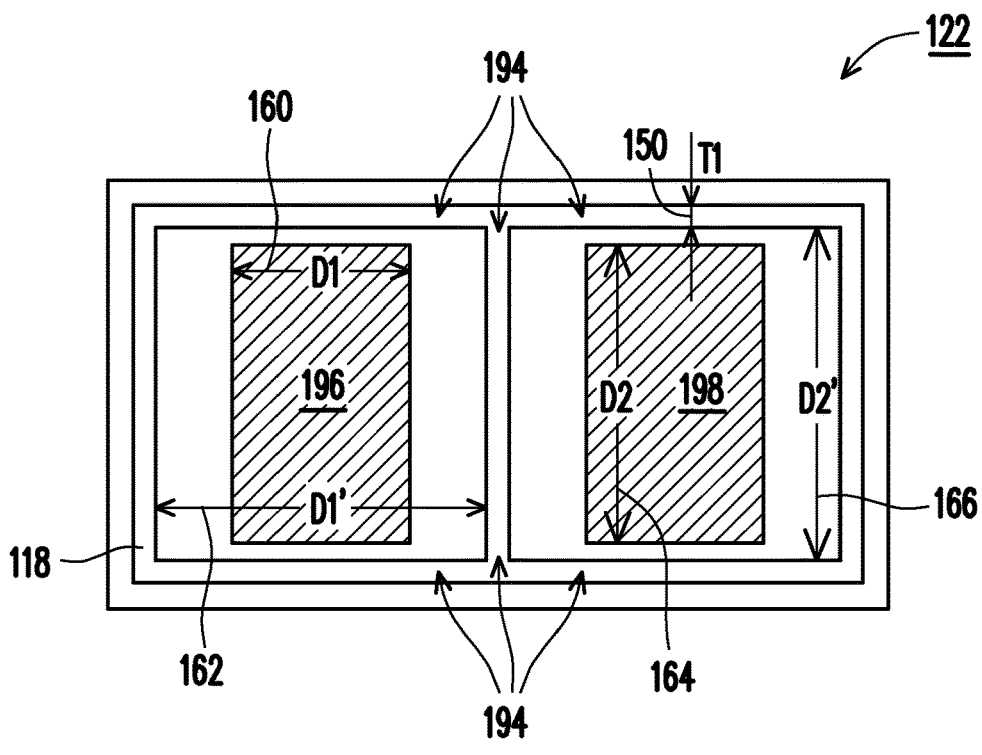
FIGS. 11A-11B are top and cross-sectional views of a fourth embodiment of an ABF plug component in accordance with one embodiment.
Figure 11B:
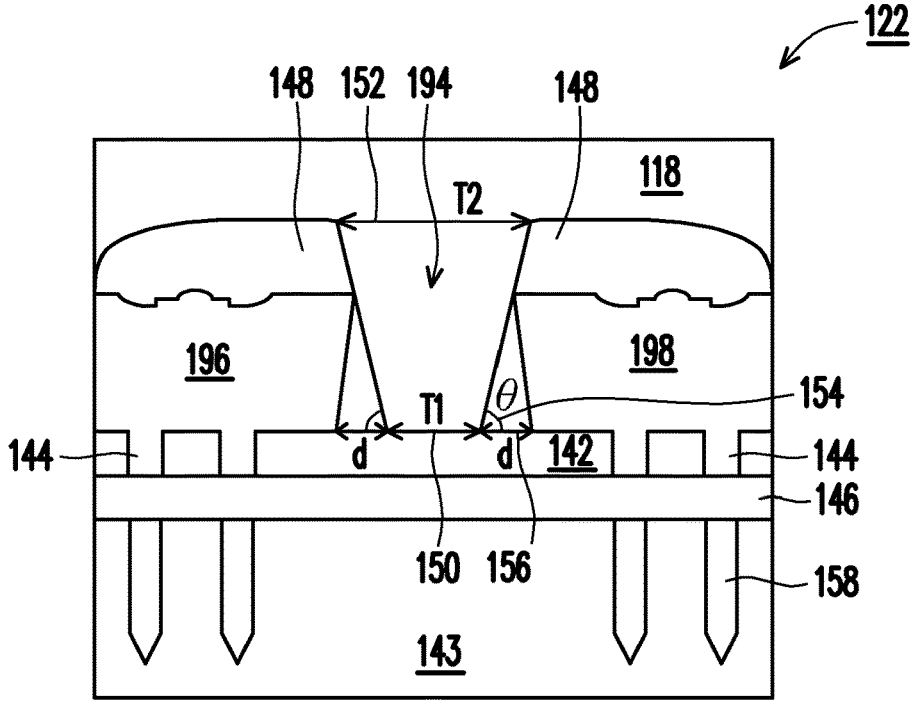

Referring now to FIGS. 11A-11B, there are shown top and cross-sectional views of a fourth embodiment of an ABF plug component 194, wherein first conductive component 196 and second conductive component 198 are conformal/wedge-shaped, tapering from a broader top down to a narrower bottom. As illustrated in FIG. 11B, it will be appreciated that the application of the isolator material 148 maintains the angled structure and conforms to the conductive elements 196-198 similarly to that described above with respect to FIG. 2. It will be appreciated that the dimensions described above with respect to FIGS. 2-3 are also applicable to the embodiment shown in FIGS. 11A-11B.

Figure 12A:
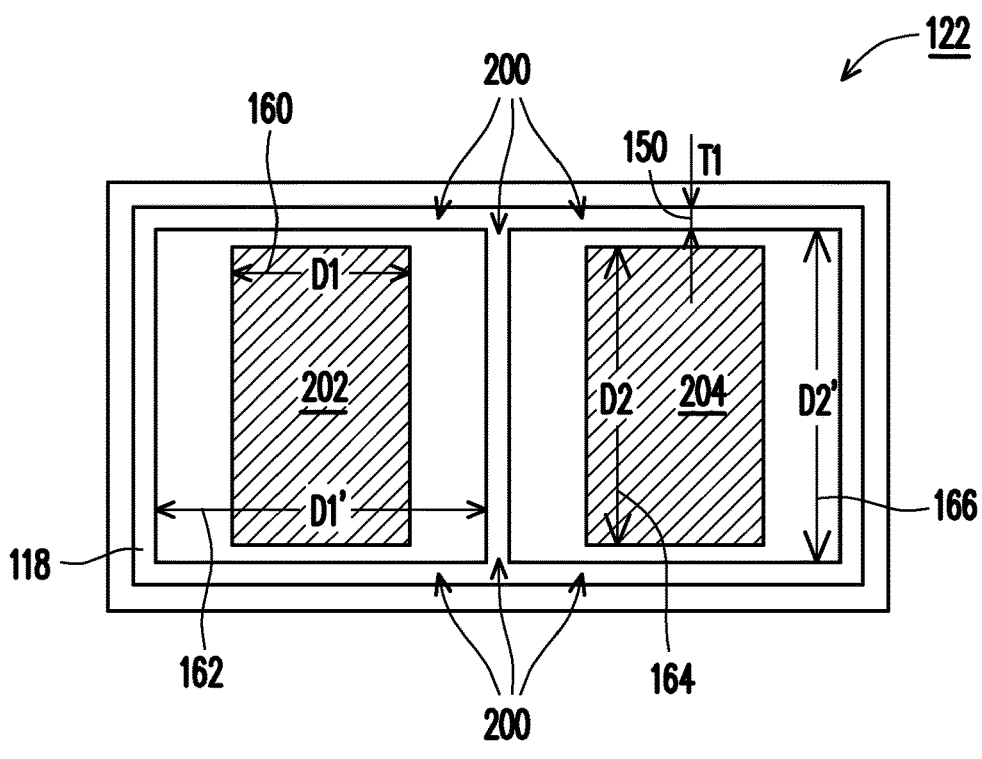
FIGS. 12A-12B are top and cross-sectional views of a fifth embodiment of an ABF plug component in accordance with one embodiment.
Figure 12B:
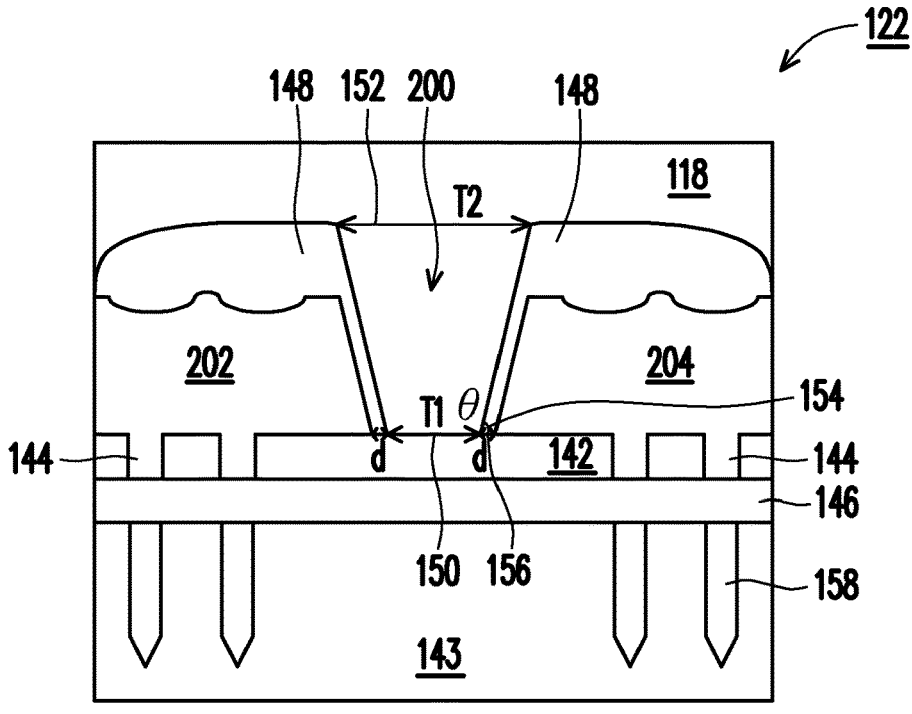

Top and cross-sectional views of a fifth embodiment of an ABF plug component 200 are shown, respectively, in FIGS. 12A-12B. As depicted in FIGS. 12A-12B, a first conductive component 202 and a second conductive component 204 are conformal/wedge-shaped, tapering from a narrower top down to a broader bottom. As illustrated in FIG. 12B, it will be appreciated that the application of the isolator material 148 maintains the angled structure and conforms to the conductive elements 202-204 similarly to that described above with respect to FIG. 2. It will be appreciated that the dimensions described above with respect to FIGS. 2-3 are also applicable to the embodiment shown in FIGS. 12A-12B.

Figure 13A:
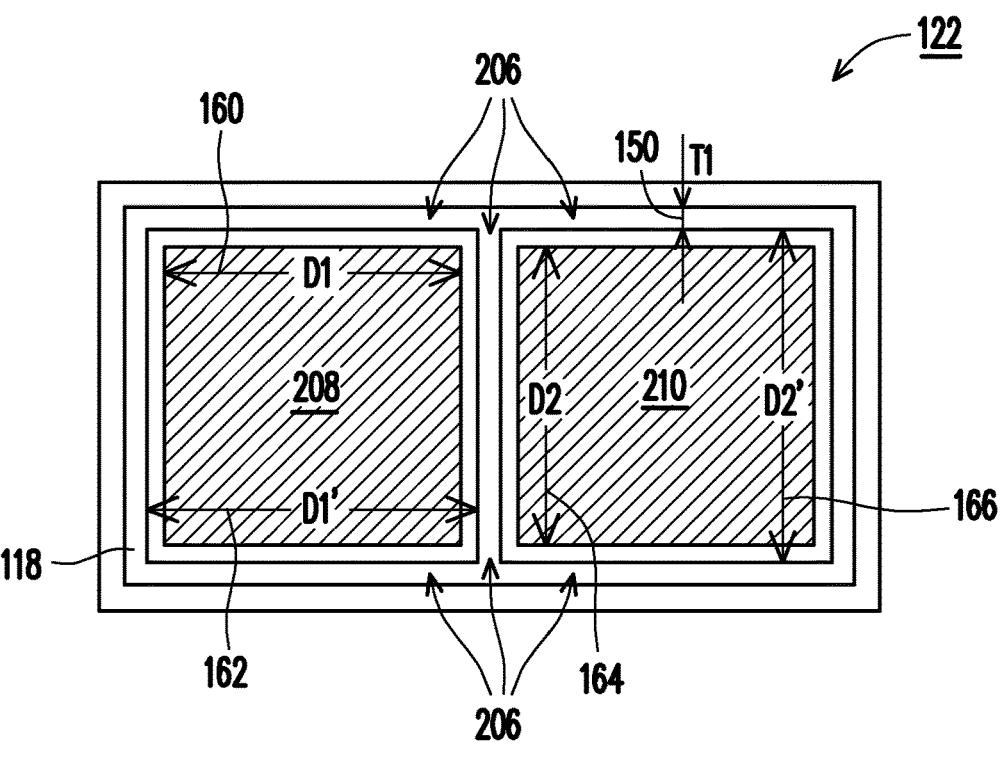
FIGS. 13A-13B, are top and cross-sectional views of a sixth embodiment of an ABF plug component in accordance with one embodiment.
Figure 13B:
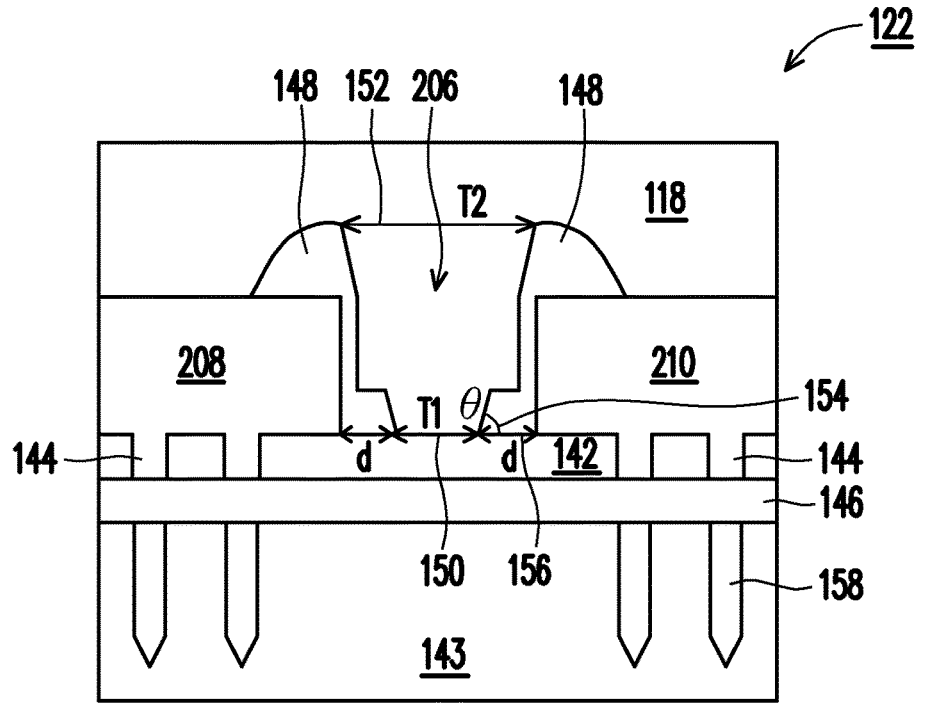

Turning now to FIGS. 13A-13B, there are shown top and cross-sectional views of a sixth embodiment of an ABF plug component 206, wherein first conductive component 208 and second conductive component 210 are shaped as described above in FIGS. 2 and 3. However, the form of the isolator material 148 results in a stairs-like ABF plug component 206. As illustrated in FIG. 13B, it will be appreciated that the application of the isolator material 148 maintains the angled structure described above with respect to FIG. 2. It will be appreciated that the dimensions described above with respect to FIGS. 2-3 are also applicable to the embodiment shown in FIGS. 13A-13B

Figure 14:
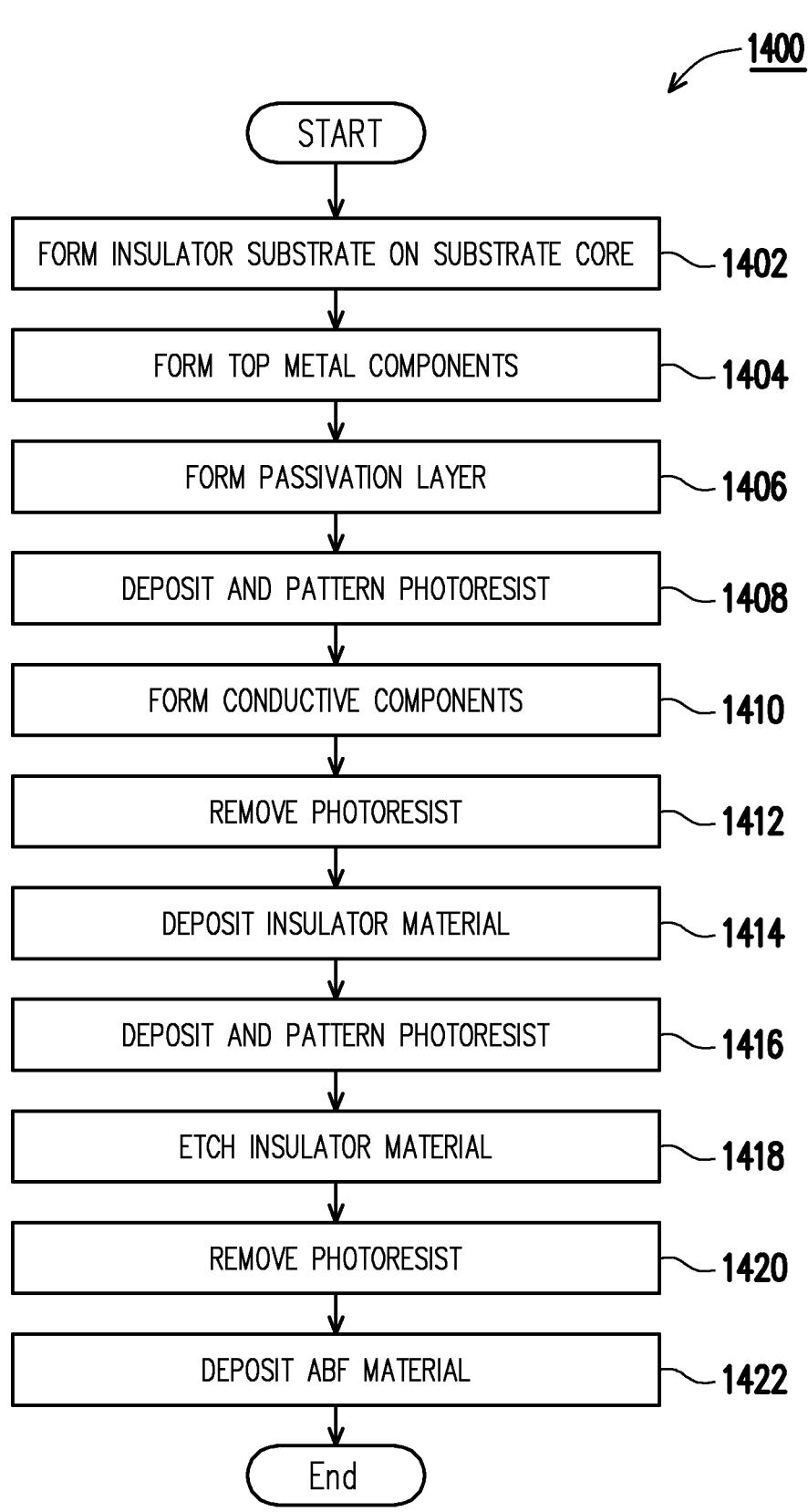
FIG. 14 is a flowchart illustrating a method of fabricating a semiconductor device in accordance with some embodiments.

Turning now to FIG. 14, there is shown a flowchart illustrating a method 1400 for fabricating an ABF plug component 136 in accordance with some embodiments. As shown in FIG. 14, the method 1400 begins at step 1402, whereupon an insulator substrate 143 is formed on a substrate core 116. At step 1404, one or more top metal components 146 are formed on the insulator substrate 143. A passivation layer 142 is then formed on the top metal components 146 and insulator substrate 143 at step 1406. As shown in FIG. 7A, the substrate core 116 includes top metal components 146 positioned the insulator substrate 143 with the passivation layer 142 deposited on the top metal components 146 and the insulator substrate 143. At step 1408, a photoresist is deposited and patterned on the passivation layer 142. Thereafter, at step 1410, one or more conductive components 138-140 are formed on the passivation layer 142, electrically contacting the top metal components 146 by vias 144. In accordance with some embodiments, the one or more conductive components 138-140 may be formed in a variety of shapes, as illustrated in FIGS. 9A-13B. That is, the formation of the conductive components 138-140 may include, for example and without limitation, wedge shapes, conical shapes, stepped shapes, conformal shapes, and the like. It will be appreciated that such formation may include the use of different masks to pattern the aforementioned photoresist, prior to deposition of the conductive components 138-140.

At step 1412, the photoresist is removed. Thereafter, at step 1414, an insulator material 148 is deposited on the substrate core 116, covering the conductive components 138-140 and portions of the passivation layer 142, as illustrated in FIG. 7C. As discussed above, the insulator material 148 may comprise, for example and without limitation, polyimide or other insulating materials. At step 1416, photoresist is applied to the insulator material 148 and patterned. Patterning of the photoresist at step 1416 may incorporate a variety of different patterns to establish the sides the ABF plug component 136. For example and without limitation, FIGS. 9A-13B illustrate a variety of different shapes relating to the application of the insulator material 148. It will be appreciated that the insulator material 148 is suitable formed on the conductive components 138-140, and the shape of the cavity 149 into which the ABF material 118 is deposited may be defined by the patterned insulator material 148, as illustrated in the various embodiments of the ABF plug component 136 shown in FIGS. 9A-13B.

Thereafter, at step 1418, insulator material 148 is etched to remove portions of the insulator material 148 are removed in accordance with the patterned photoresist. Suitable forms of etching may include, for example and without limitation, a dry etching process, a RIE process, a wet etching process, some other etching process, or a combination of the foregoing. In some embodiments, the insulator material 148 is removed from between adjacent conductive components 138-140 forming the aforementioned cavities 149 therebetween and a portion of the top of the conductive components 138-140, as illustrated in FIG. 7D. The photoresist is then removed at step 1420. Thereafter, at step 1422, ABF material 118 is deposited on the substrate core 116, as illustrated in FIG. 7E. It will be appreciated that the deposition of the ABF material 118 on the substrate core 116 fills the cavities between the conductive components 138-140, thereby forming the ABF plug components 136.

Passive components suffered from serious power short issue after bHAST (biased highly accelerated stress test) due to delamination of conductive element/insulator material (Cu/PI) and passivation layer/insulator material (Passivation/PI) interfaces. Since Tg of ABF is low, the delamination can be triggered by serious strain of ABF during substrate assembly. In ABF plug structure, thermal strain of ABF can prevent Cu/PI and Passivation/PI from delamination by thermal expansion, which can further mitigate Cu dendrite formation.

In accordance with a first embodiment, there is provided a method for forming an ABF plug component in a semiconductor device. At least one top metal component is formed on a substrate core that includes an insulator substrate, and a passivation layer is formed on the top metal component and the insulator substrate. One or more conductive components of a passive component are formed on the passivation layer, electrically contacting the top metal component. An insulator material is then deposited on the substrate core, over the conductive component and portions of the passivation layer. The insulator material is then patterned to define a cavity adjacent to the conductive component and an ABF material is deposited on the insulator material to form an ABF plug component.

In accordance with a second embodiment, there is provided a passive device of a semiconductor substrate. The passive device includes first and second top metal components positioned on a substrate core that includes an insulator substrate. A passivation layer is formed over the top metal components and insulator substrate. The device further includes a first conductive component that is formed on the passivation layer and that electrically contacts the first top metal component, as well as a second conductive component that is formed on the passivation layer and electrically contacts the second top metal component. In addition, the device includes an insulator material that is formed over the first conductive component and the second conductive component. A cavity is defined by the insulator material between the first conductive component and the second conductive component. The device further includes an ABF plug component that is formed in the cavity between the first conductive component and the second conductive component.

In accordance with a third embodiment, there is provided a semiconductor device that includes a substrate having one or more passive device components, wherein each of the passive device components includes a first conductive component and a second conductive component. In addition, each passive device component further includes an ABF plug component positioned between the first and second conductive components. The semiconductor device further includes a system on chip (SoC) component, a first DRAM component, and a second DRAM component. The system on chip (SoC) component, the first DRAM component, and the second DRAM component are electrically coupled to the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A passive device of a semiconductor substrate, comprising:
   first and second top metal components positioned on a substrate core including an insulator substrate;
   a passivation layer formed over the first and second top metal components and insulator substrate;
   a first conductive component formed on the passivation layer and electrically contacting the first top metal component;
   a second conductive component formed on the passivation layer and electrically contacting the second top metal component;
   an insulator material formed over the first conductive component and the second conductive component, wherein a cavity is defined by the insulator material between the first conductive component and the second conductive component; and
   an Ajinomoto Build-up Film (ABF) plug component formed in the cavity between the first conductive component and the second conductive component.

2. The passive device of claim 1, wherein the first conductive component and the second conductive component have a cross-sectional shape selected from the group consisting of a wedge having a broader base, a wedge having a broader top, a wedge having a conformal top and broader base, a wedge having a conformal top and a broader top.

3. The passive device of claim 1, wherein the ABF plug component includes:
   a bottom insulator opening T1, a top insulator opening T2, and an insulator material thickness d at the bottom insulator opening T1; and
   wherein $0 \ \mu m < d/T2 < T1/T2 < 1 \ \mu m$.

4. The passive device of claim 3, wherein the insulator material has an angle ($\theta$) at the bottom insulator opening T1, and wherein $0° < \theta < 90°$.

5. The passive device of claim 4, wherein the ABF plug component is wedge or stair shaped.

6. The passive device of claim 4, wherein the at least one conductive component includes a length D1, and a length D1' corresponding to a corner to corner of the insulator material on a top of the conductive component in the x-direction, and wherein $0 \ \mu m < D1/D1' < 1 \ \mu m$.

7. The passive device of claim 6, wherein the at least one conductive component includes a width D2, and a width D2' corresponding to a corner to corner of the insulator material on a top of the conductive component in the y-direction, and wherein 0 um<$D2/D2'$<1 um.

8. The passive device of claim 1, wherein the insulator material is a polyimide material.

9. A semiconductor device, comprising:

a substrate comprising at least one passive device component, the at least one passive device component including a first conductive component and a second conductive component, and wherein the at least one passive device component further includes an Ajinomoto Build-up Film (ABF) plug component positioned between the first and second conductive components;

a system on chip (SoC) component;

a first DRAM component; and a second DRAM component; wherein the system on chip (SoC) component, the first DRAM component and the second DRAM component are electrically coupled to the substrate.

10. The semiconductor device of claim 9, wherein the ABF plug component is wedge or stair shaped.

11. The semiconductor device of claim 10, wherein the at least one passive device further comprises an insulator material formed over the first conductive component and the second conductive component, wherein a cavity is defined by the insulator material between the first conductive component and the second conductive component, and wherein the ABF plug component is formed in the cavity between the first conductive component and the second conductive component.

12. The semiconductor device of claim 10, wherein the insulator material is a polyimide material.

13. A semiconductor substrate electrode interconnect structure comprising:

a first conductive pin and a second conductive pin formed on an insulator substrate associated with a semiconductor device;

a passivation layer formed over the first and second conductive pins and insulator substrate;

a first electrode formed on the passivation layer, the first electrode electrically connected to the first conductive pin;

a second electrode formed on the passivation layer, the second electrode electrically connected to the second conductive pin;

a first insulating layer formed on the first electrode and a second insulating layer formed on the second electrode, wherein the first insulating layer and the second insulating layer are formed of a first insulator material and a cavity is formed between the first electrode and the second electrode by the first insulating layer and the second insulating layer; and an insulating plug formed in the cavity between the first conductive component and the second conductive component, wherein the insulating plug is formed of a second insulator material including an epoxy based material that applies a tensile force to the first insulating and the second insulating layers during a curing of the second insulator material.

14. The semiconductor substrate electrode interconnect structure of claim 13, wherein the first electrode and the second electrode have a cross-sectional shape selected from the group consisting of a wedge having a broader base, a wedge having a broader top, a wedge having a conformal top and broader base, a wedge having a conformal top and a broader top.

15. The semiconductor substrate electrode interconnect structure of claim 13, wherein the insulating plug includes:

a bottom insulator opening T1, a top insulator opening T2, and a second insulator material thickness d at the bottom insulator opening T1; and wherein 0 um<$d/T2$<$T1/T2$<1 um.

16. The semiconductor substrate electrode interconnect structure of claim 15, wherein the second insulator material has an angle ($\theta$) at the bottom insulator opening T1, and wherein $0°<\theta<90°$.

17. The semiconductor substrate electrode interconnect structure of claim 16, wherein the insulating plug is wedge or stair shaped.

18. The semiconductor substrate electrode interconnect structure of claim 16, wherein the first electrode and the second electrode have lengths D1 in an x-direction, and the first insulating layer has a length D1' corresponding to a corner to corner length of the first insulating layer in the x-direction, and wherein 0 um<$D1/D1'$<1 um.

19. The semiconductor substrate electrode interconnect structure of claim 18, wherein the first electrode and the second electrode have a width D2 in a y-direction, and the first insulating layer has a width D2' corresponding to a corner to corner width of the first insulating layer in the y-direction, and wherein 0 um<$D2/D2'$<1 um.

20. The semiconductor substrate electrode interconnect structure of claim 13, wherein the first insulator material is a polyimide material.

* * * * *